US006212669B1

(12) United States Patent
Jain

(10) Patent No.: US 6,212,669 B1
(45) Date of Patent: *Apr. 3, 2001

(54) METHOD FOR VERIFYING AND REPRESENTING HARDWARE BY DECOMPOSITION AND PARTITIONING

(75) Inventor: Jawahar Jain, Santa Clara, CA (US)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/964,904

(22) Filed: Nov. 5, 1997

(51) Int. Cl.$^7$ .................................................. G06F 17/50

(52) U.S. Cl. .................................................................. 716/7

(58) Field of Search .................................... 364/488, 489, 364/490, 491, 578; 716/18, 5

(56) References Cited

U.S. PATENT DOCUMENTS

| 5,243,538 |   | 9/1993  | Okuzawa et al. ..................... 364/489 |
|-----------|---|---------|----------------------------------------------|
| 5,349,659 |   | 9/1994  | Do et al. .............................. 395/700 |
| 5,377,201 |   | 12/1994 | Chakradhar et al. .................. 371/23  |
| 5,469,367 | * | 11/1995 | Puri et al. ............................ 364/489 |
| 5,481,473 |   | 1/1996  | Kim et al. ............................ 364/490 |
| 5,485,471 |   | 1/1996  | Bershteyn ............................. 371/27  |
| 5,497,334 |   | 3/1996  | Russell et al. ....................... 264/489 |
| 5,522,063 |   | 5/1996  | Ashar et al. ......................... 395/500 |
| 5,526,514 |   | 6/1996  | Pradhan et al. ...................... 395/500 |
| 5,528,508 |   | 6/1996  | Russell et al. ....................... 364/488 |
| 5,649,165 | * | 7/1997  | Jain ..................................... 364/491 |
| 5,671,399 |   | 9/1997  | Meier .................................... 395/500 |
| 5,787,006 |   | 7/1998  | Chevallier et al. .................. 364/488 |
| 5,801,958 | * | 9/1998  | Dangelo ............................... 716/18  |
| 5,805,462 | * | 9/1998  | Poirot .................................. 364/490 |

OTHER PUBLICATIONS

Bryant, R. E. et al, "Verification of Arithmetic Circuits with Binary Moment Diagrams", $32^{nd}$ Design Automation Conference, Proceedings 1995 (IEEE Cat. No. 95CH35812), Proceedings of the 32nd Design Automation Conference, San Francisco, CA, USA, Jun. 12–16, 1995, pp. 535–541, XP000546358 1995, New York, NY, USA, ACM, USA ISBN: 0–89791–725–1.

Chen, Y. et al., "ACV: An Arithmetic Circuit Verifier", 1996 IEEE/ACM International Conference on Computer–Aided Design, Digest of Technical Papers (Cat. No. 96CB35991), Proceedings of International Conference Aided Design, San Jose, CA, USA, Nov. 10–14, 1996, pp. 361–365, XP000738433 1996, Los Alamitos, CA, USA, IEEE Comput. Soc. Press, USA, ISBN: 0–8186–7597–7.

Jain J. et al., "Formal Verification of Combinational Circuits", Proceedings Tenth International conference on VLSI Design (Cat. No. 97TB100095), Proceedings Tenth International Conference on VLSI Design, Hyderabad, India, Jan. 4–7, 1997, pp. 218–225, XP002120998 1997, Los Alamitos, CA, USA, IEEE Comput. Soc. Press, USA ISBN: 0–8186–7755–4.

(List continued on next page.)

Primary Examiner—Paul R. Lintz
Assistant Examiner—Thuan Do
(74) Attorney, Agent, or Firm—Christie, Parker & Hale, LLP

(57) ABSTRACT

A system and method for representing digital circuits and systems in multiple partitions of Boolean space, and for performing digital circuit or system validation using the multiple partitions. Decision diagrams are built for the digital circuit or system and pseudo-variables are introduced at decomposition points to reduce diagram size. Pseudo-variables remaining after decomposition are composed and partitioned to represent the digital circuit or system as multiple partitions of Boolean space. Each partition is built in a scheduled order, and is manipulable separately from other partitions.

20 Claims, 11 Drawing Sheets

OTHER PUBLICATIONS

Matsunga, Y., "An Efficient Equivalence Checker for Combinational Circuits" 33$^{rd}$ Design Automation Conference, Proceedings 1996 (IEEE Cat. No. 96CH35932), Proceedings of 33$^{rd}$ Design Automation conference, Las Vegas, NV, USA, Jun. 3–7, 1996, pp. 629–634, XP002120999 1996, New York, NY, USA, ACM, USA ISBN: 0–89791–779–0.

Muhkerjee, R. et al., "Efficient Combinational Verification using BDDs and a Hash Table", Proceedings of 1997 IEEE International Symposium on Circuits and Systems, Circuits and Systems in the Information Age, ISCAS '97 (Cat. No. 97CH35987), Proceedings of 1997 IEEE International Symposium on Circuits and Systems, pp. 1025–1028, vol. 2, XP002120997, 1997, New York, NY, USA, IEEE, USA, ISBN: 0–7803–3583–X.

European Patent Office Search Report Communication, Nov. 11, 1999, pp. 1–5.

Akers, Binary Decision Diagrams, *IEEE Transactions on Computers*, vol. C–27, Jun. 1978, pp. 509–516.

Auth, et al., Improved Test Pattern Generation For Sequential Circuits Using Implicit Enumeration, *IEEE 1992*, pp. 1137–1140.

Berman, et al., Functional Comparison of Logic Designs for VLSI Circuits, *1989 IEEE International Conference on Computer–Aided Design: Digest of Technical Papers*, 1989, pp. 456–459.

Brand, Verification of Large Synthesized Designs, *1993 IEEE/ACM International Conference on Computer–Aided Design: Digest of Technical Papers*, 1993, pp. 534–537.

Bryant, Symbolic Boolean Manipulation with Ordered Binary–Decision Diagrams, *ACM Computing Surveys*, vol. 24, Sep. 1992, pp. 293–318.

Bryant, Graph–Based Algorithms for Boolean Function Manipulation, *IEEE Transactions on Computers*, vol. C–35, Aug. 1986, pp. 677–691.

Cerny, et al., Digest of Technical Papers, Tautology Checking Using Cross–Controllability and Cross–Observability Relations, *1990 IEEE International Conference on Computer–Aided Design*, 1990, pp. 34–37.

Chakradhar, et al., A Transitive Closure Algorithm for Test Generation, *IEEE Transactions on Computer–Aided Design of Integrated Circuits and Systems*, vol. 12, 1993, pp. 1015–1027.

Coudert, et al., A Unified Framework for the Formal Verification of Sequential Circuits, *IEEE 1990*, pp. 126–129.

Drechsler, et al., Efficient Representation and Manipulation of Switching Functions Based on Ordered Kronecker Functional Decision Diagrams, *ACM 1994*, pp. 415–419.

Fujita, et al., Evaluation and Improvements of Boolean Comparison Method Based on Binary Decision Diagrams, *IEEE 1988*, pp. 2–5.

Karplus, Using If–then–else DAGS for Multi–Level Logic Minimization, *Advanced Research In VLSI: Proceedings of the Decennial Caltech Conference on VLSI*, Mar. 1989, pp. 101–117.

Kunz, Hannibal: An Efficient Tool for Logic Verification Based on Recursive Learning, IEEE 1993, pp. 538–543.

Kunz, et al., Recursive Learning: An attractive alternative to the decision tree for test generation in digital circuits, *International Test Conference 1993*, pp. 816–825.

Malik, et al., Logic Verification using Binary Decision Diagrams in a Logic Synthesis Environment, *IEEE 1988*, pp. 6–9.

Mukherjee, et al., Functional Learning: A New Approach to Learning in Digital Circuits, *Technical Report 94–020*, Department of Computer Science, Texas A&M University, 16 pages.

Mukherjee, Application of Functional Learning to ATPG and Design Verification for Combinational Circuits, Dec. 1994, 73 pages.

Rudell, Dynamic Variable Ordering Binary Decision Diagrams, *IEEE 1993*, pp. 42–47.

Schulz, et al., *Advanced Automatic Test Pattern Generation and Redundancy Identification Techniques*, 1988, pp. 30–35.

Schulz, Socrates: A Highly Efficient Automatic Test Pattern Generation System, *International Test Conference*, 1987, pp. 1016–1026.

* cited by examiner

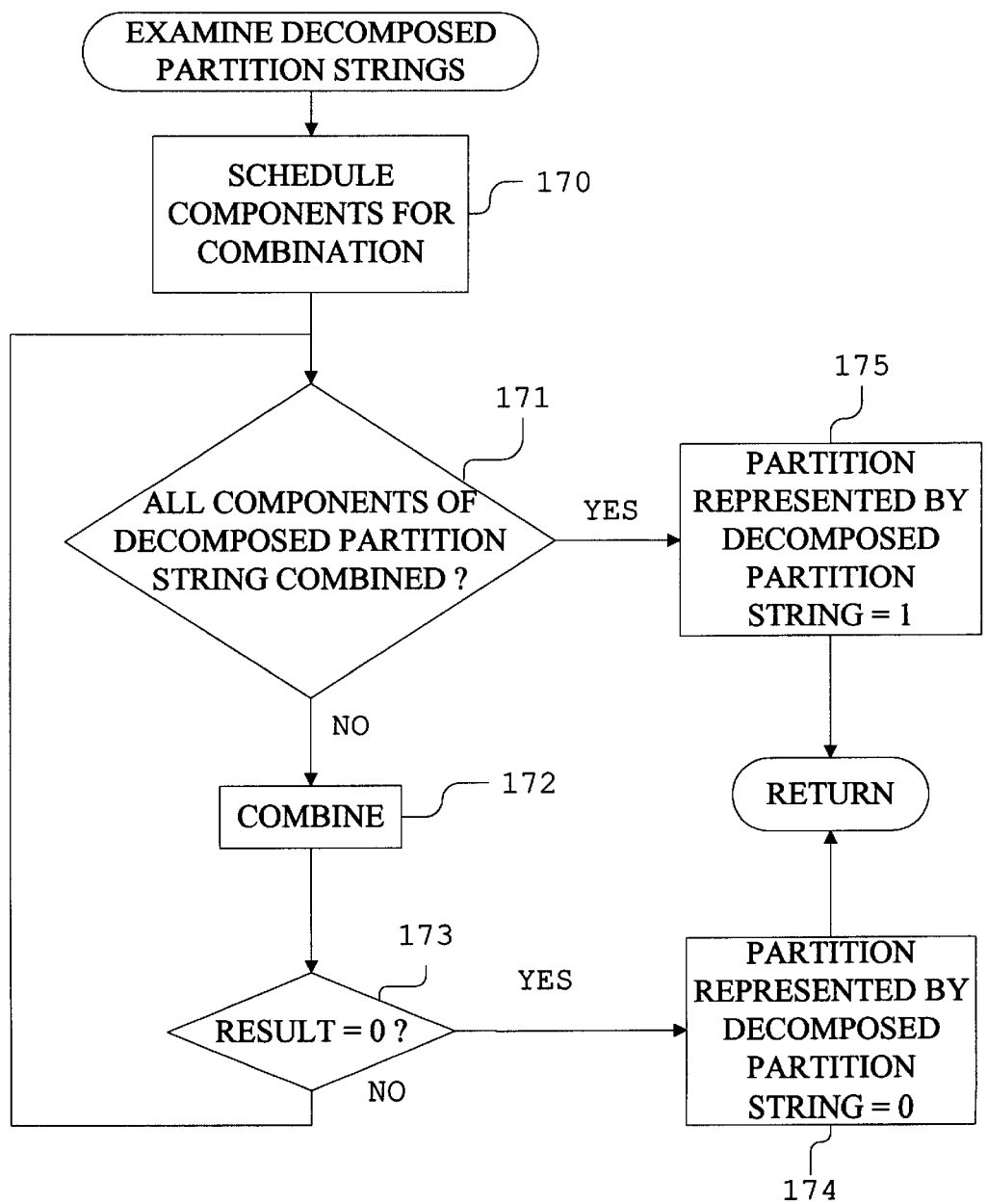

METHOD FOR VERIFYING AND REPRESENTING HARDWARE BY DECOMPOSITION AND PARTITIONING

BACKGROUND OF THE INVENTION

The present invention relates generally to the field of computer-aided design (CAD) systems and methods, and in particular to CAD systems and methods for digital circuit design and verification.

Computer-aided design of digital circuits and other complex digital systems is widely prevalent. In such computer-aided design, circuits and systems are usually designed in a hierarchial manner. The requirements of the circuit or system are defined in an abstract model of the circuit or system. The abstract model is then successively transformed into a number of intermediate stages. These intermediate stages often include a register transfer level model which represents a block structure behavioral design, and a structural model which is a logic level description of the system. Eventually a transistor net list and consequently the physical layout of the circuit or system are derived.

The design of the circuit or system therefore proceeds from the general requirements level to the lower detailed level of a physical design, interposed between which are a number of intermediate levels. Each successive level of the design is tested or verified to ensure that the circuit or system continues to meet the design requirements. It is highly desirable to verify each level in the design as errors in one level of the design that are not corrected until after further levels have been designed drastically increases the cost of correcting such errors. Thus, it is important to test each level of the design against the requirements. As each level of the design is tested against the requirements, this task resolves to the task of comparing each level of the design to the prior level of the design. This testing of succeeding levels against immediately preceding levels can also be intuitively seen when it is realized that each succeeding level is often merely an optimization of the preceding level. Thus, the testing or verification of circuit designs can, to an extent, be viewed as similar to checking the backward compatibility of successive generations of circuits or systems.

Binary decision diagrams (BDDs) have been used to solve CAD related problems. These problems include synthesis problems, digital-system verification, protocol validation, and generally verifying the correctness of circuits. BDDs represent Boolean functions. For example, FIG. 1 shows a circuit comprising first and second OR gates 11, 13, and an AND gate 15. The first OR gate has inputs N1 and N2. The second OR gate has inputs N2 and N3, with input N2 being shared by the two OR gates. The outputs of the OR gates are fed into the AND gate. The AND gate has an output N6. Thus, the output of the AND gate can be represented by the boolean function N6=(N1 OR N2) AND (N2 OR N3).

A BDD for this circuit is shown in FIG. 2. The BDD is composed of vertices, which may also be called nodes, and branches. Vertices from which no further branches extend are termed terminal vertices. The BDD is an Ordered BDD (OBDD) as each input is restricted to appearing only at one level of the BDD. The BDD may be reduced to a Reduced OBDD (ROBDD) as shown in FIG. 3. The rules for reducing OBDDs are known in the art. These rules include eliminating redundant or isomorphic nodes, and by recognizing that some nodes can be eliminated by exchanging the branches of a node with a node or its complement. The importance of ROBDDs is that ROBDDs are unique, i.e., canonical. Thus, if two OBDDs reduce to the same ROBDD, the circuits represented by the OBDDs are equivalent.

In most applications, ROBDDs are constructed using some variant of the Apply procedure described in R. E. Bryant, Graph-Based Algorithms For Boolean Function Manipulation, IEEE Trans. Computer C-35(8): 667–691, August 1986, incorporated by reference herein. Using the Apply procedure the ROBDD for a gate g is synthesized by the symbolic manipulation of the ROBDDs of gate g's inputs. Given a circuit, the gates of the circuit are processed in a depth-first manner until the ROBDDs of the desired output gates are constructed.

A large number of problems in VLSI-CAD and other areas of computer science can be formulated in terms of Boolean functions. Accordingly, ROBDDs are useful for performing equivalence checks. A central issue, however, in providing computer aided solutions and equivalence checking is to find a compact representation for the Boolean functions so that the equivalence check can be efficiently performed. ROBDDs are efficiently manipulable, and as previously stated, are canonical. In many practical functions ROBDDs are compact as well, both in terms of size (memory space) and computational time. Accordingly, ROBDDs are frequently used as the Boolean representation of choice to solve various CAD problems.

ROBDDs, however, are not always compact. In a large number of cases of practical interest, many ROBDDs representing a circuit or system described by a Boolean function may require space which is exponential in the number of primary inputs (PIs) to the circuit or system. This makes solving for equivalence an NP-hard problem. The large space requirement, either in terms of memory or computational time, places limits on the complexity of problems which can be solved using ROBDDs.

Various methods have been proposed to improve the compactness of ROBDDs. Some of these methods improve compactness, but do not maintain canonicity and manipulability of the ROBDDs. Such methods reduce the applicability of the use of ROBDDs. Other methods, which maintain canonicity and manipulability, represent the function over the entire Boolean space as a single graph rooted at an unique source. A requirement of a single graph, however, may still result in ROBDDs of such a size that either memory or time constraints are exceeded.

Methods of reducing the size of ROBDDs have been proposed. The size of an ROBDD is strongly dependent on its ordering of variables. Therefore, many algorithms have been proposed to determine variable orders which reduce the size of ROBDDs. For some Boolean functions, however, it is possible that no variable order results in a ROBDD sufficiently small to be useful, or that no such variable order can be efficiently found.

The space and time requirements of ROBDDs may also be reduced by relaxing the total ordering requirement. A Free BDD is an example of such an approach. A Free BDD (FBDD) is a BDD in which variables can appear only once in a given path from the source to the terminal, but different paths can have different variable orderings.

Another approach to obtain a more compact representation for Boolean functions is to change the function decomposition associated with the nodes. Generally, a BDD decomposition is based on the Shannon Expansion in which a function $f$ is expressed as $xf_x + \bar{x}f_{\bar{x}}$, or methods derived from the Shannon expansion such as the Apply method. Some other decompositions include the Reed-Muller expansion, or the use of expansion hybrids such as Functional Decision Diagrams (FDDs), or through the use of Ordered Kronecker Functional Decision Diagrams (OKFDDs). All of these methods, however, represent a function over the entire Boolean space as a single graph rooted at a unique source. Thus, these methods still face problems of memory and time constraints.

Furthermore, many designs, particularly for sequential circuits, are not adequately verified. Usually a test-suite is prepared to test such designs. The test-suite includes a number of test cases in which the design is subjected to varying combinations of assignments for the primary inputs of the design. A single combination of assignments for the primary inputs forms an input vector. A sequence of input vectors, used to test designs having sequential elements such as flip-flops, forms a test vector.

Test-suites are often prepared by engineers with specialized knowledge of the design being tested. Therefore test-suites are useful test devices. However, test-suites only test a very small portion of a state or Boolean space of the design. For designs with an appreciable number of primary inputs or possible test vectors, test-suites do not test a substantial portion of input vectors or test vectors of particular interest.

SUMMARY OF THE INVENTION

The present invention provides a method and system for evaluating digital circuits and systems that are otherwise unverifiable through the use of BDD-based verification techniques using windows of Boolean space representations of the digital circuits and systems. In a preferred embodiment, the digital circuit or system is represented as a Boolean function forming a Boolean space. The Boolean space is partitioned into partitions, which may be recursively partitioned into still further partitions. Partitions which are otherwise too large for the formation of a BDD are expressed in terms of a decomposed partition string having components or elements combinable to form the partition. These components or elements are combined in a scheduled order. If any of the combinations result in zero then the decomposed partition string also results in zero. Thus, combining all of the components or elements is unnecessary if any sub-combination results in zero, thereby allowing evaluation of the partition represented by the decomposed partition string.

Accordingly, the present invention provides a method and system of verifying the equivalence of first and second circuits. The first and second circuits have corresponding sets of primary inputs and primary outputs. The first and second circuits are represented as Boolean functions and a Boolean space is represented by exclusive ORing the corresponding outputs of the Boolean functions. In building a decomposed Binary Decision Diagram for the Boolean space the Boolean space is partitioned during composition of a decomposition point when the Binary Decision Diagram resulting from composition exceeds a predetermined constraint on computer memory usage. The circuits can then be determined to be equivalent if all of the resulting partitions are zero.

Moreover, the present invention provides a sampling method for use in the partial verification of otherwise unverifiable circuits, systems, and designs thereof. The state space of the circuit, system, or design is partitioned into multiple partitions. These partitions are formed through any of several methods, including methods that analyze test-suites for the circuit, system, or design. Additionally, if an intermediate BDD exceeds predefined constraints on memory usage the BDD can be replaced with a zero terminal vertice and other partitions of the state space evaluated.

These and other features of the present invention will be more readily appreciated as the same becomes better understood by reference to the following detailed description when considered in connection with the accompanying drawings.

BRIEF DESCRIPTION OF THE DRAWINGS

FIG. 17 is a flow diagram illustrating the decomposed partition string combination technique of the present invention.

DETAILED DESCRIPTION OF THE INVENTION

I. Overview

The present invention comprises a method and system of circuit or system verification wherein partitioning a Boolean logic space representing the circuit or system is performed by composing at decomposition points. Each composition partitions the Boolean space into two separate partitions. Composition is performed through use of Shannon's equation and a functional restriction on the BDDs. Thus, each partition represents a disjoint part of Boolean space.

In determining if a first circuit is equivalent to a second circuit each primary output of the two circuits are combined in an exclusive OR (XOR) operation. If the outputs of all of the XOR operations are always equal to zero, then the two circuits are equivalent. Accordingly, the entire Boolean space therefore comprises a representation F of a first circuit and a representation G of a second circuit, the primary outputs of which are combined in an XOR operation. Thus, for circuits represented by F and G to be equivalent, the Boolean space of F XOR G must always be zero. If the Boolean space of F XOR G is partitioned into any number of disjoint partitions, each of those partitions must also be equal to zero for the entire Boolean space of F XOR G to be zero. Thus, OBDDs may be built for each of the separate partitions, and each of the OBDDs can be checked to determine if the OBDDs reduce to zero, i.e., only have a single terminal vertex equal to zero. If all of the partitions reduce to zero, then F XOR G reduces to zero, and F and G represent equivalent circuits.

Alternatively, the representations F and G may be manipulated separately, and resulting ROBDDs subsequently compared.

The use of partitioned ROBDDs means that only one ROBDD, which represents less than all of the Boolean space, is required to be located in memory at any given time. As each partitioned ROBDD is smaller than any monolithic ROBDD, additional classes of problems which are otherwise unsolvable due to time and memory space constraints are now solvable. Additionally, as each partitioned ROBDD must reduce to zero for the circuits to be equivalent, processing may stop as soon as a partitioned ROBDD is found that does not reduce to zero, thereby saving additional processing time. Moreover, the variable ordering of each ROBDD can be different, thus further reducing the size of individual ROBDDs.

Partitions are formed by composing decomposition points. Decomposition points are found in a number of ways. If a point is a known equivalent point, a partition is formed at the decomposition point using the equivalent OBDD.

Figure 9:
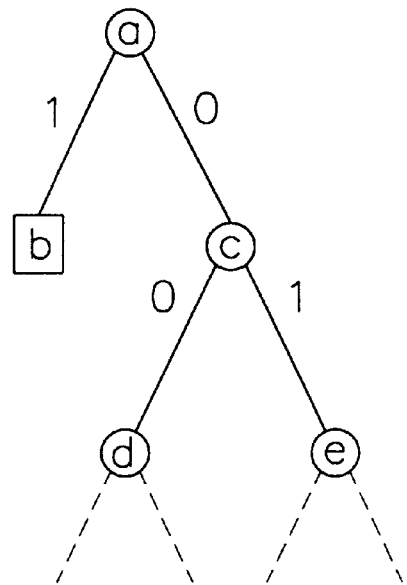
FIG. 9 is a BDD incorporating pseudo variable.

Decomposition points are also determined based on explosion principles. Monolithic OBDD's are generally built from the primary inputs towards the primary outputs using the Apply procedure. This is done until a monolithic OBDD which expresses the primary outputs in terms of the primary inputs is constructed. If during this process an OBDD about a node explodes in terms of memory usage, then that point is marked as a decomposition point, and the point is turned into a pseudo-variable. In building OBDD's closer to the primary outputs the pseudo-variable is used in place of the OBDD that would otherwise be used. A BDD utilizing a pseudo-variable b is illustrated in FIG. 9.

Figure 13:
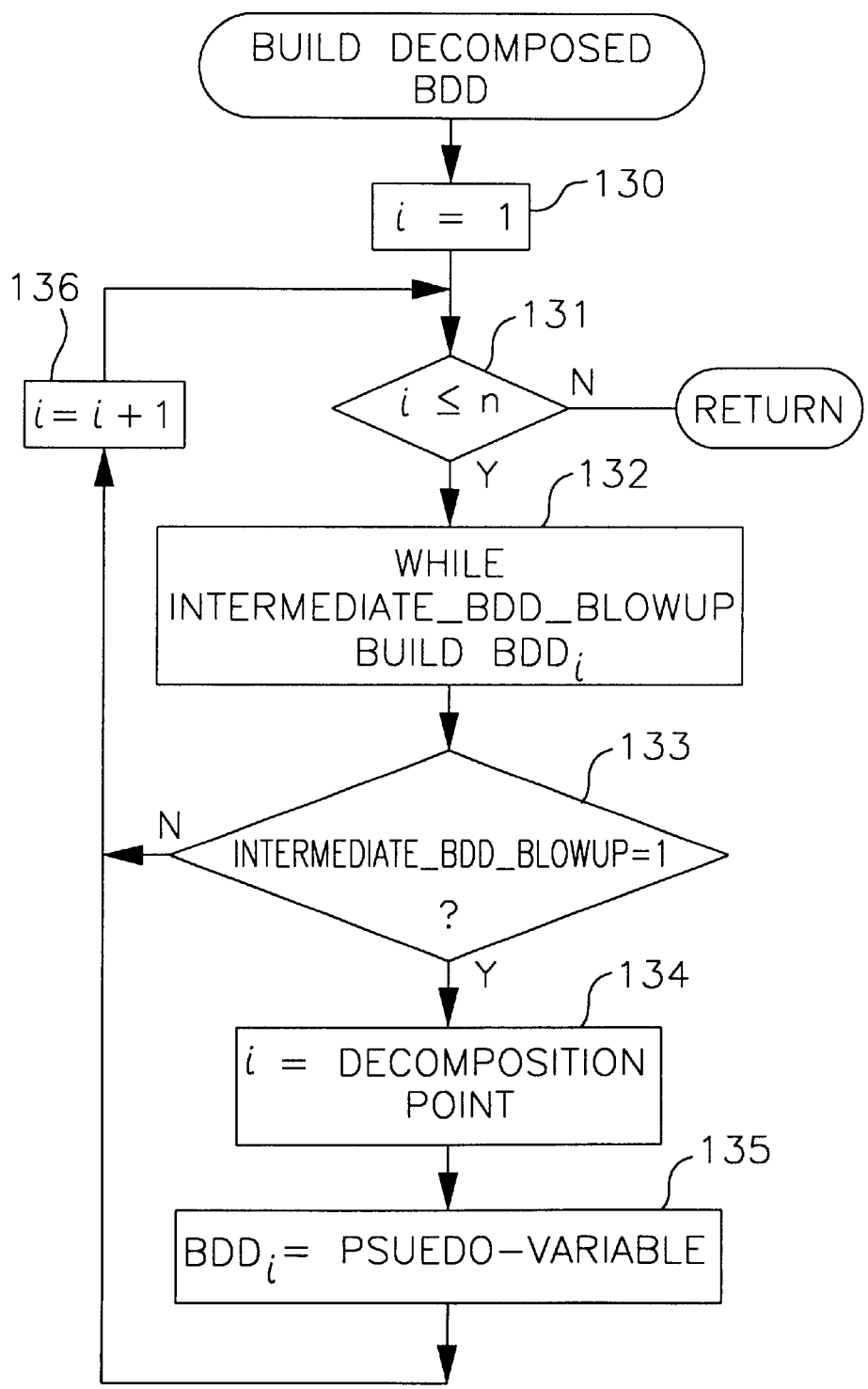
FIG. 13 is a flow diagram illustrating a method of determining decomposition points of the present invention.

A procedure for determining decomposition points in the context of building a decomposed BDD for a circuit representation having n gates or nodes is illustrated in FIG. 13. In Step 130 a counter is set to the first primary input. Step 131 determines if BDDs have been attempted to be built for all gates or nodes. Step 132 builds intermediate BDDs for each gate or node until a BDD blow-up in terms of size occurs. If such a blow-up occurs, Step 134 marks the gate or node as a decomposition point and Step 135 inserts a pseudo-variable for the BDD for the gate or node marked as a decomposition point.

Figure 1:
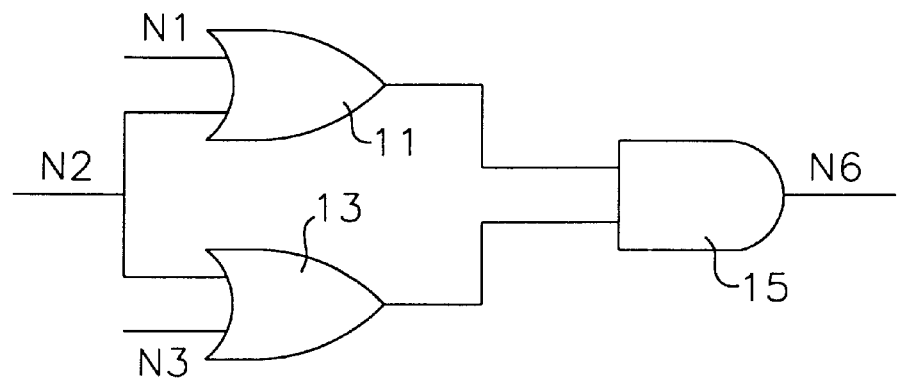
FIG. 1 is a logic design schematic illustrating the topology of a digital logic circuit.
Figure 2:
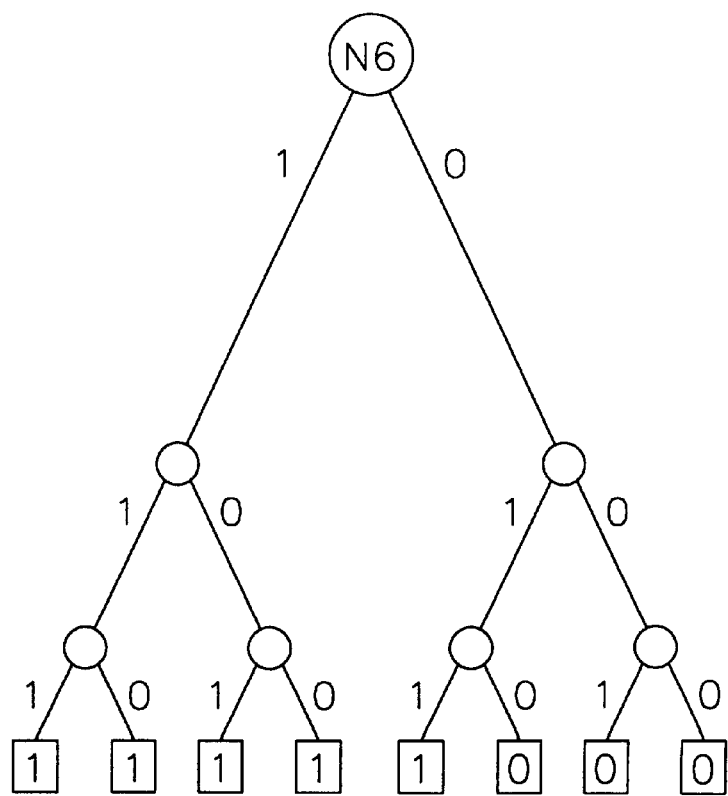
FIG. 2 is a BDD for the circuit of FIG. 1.
Figure 3:
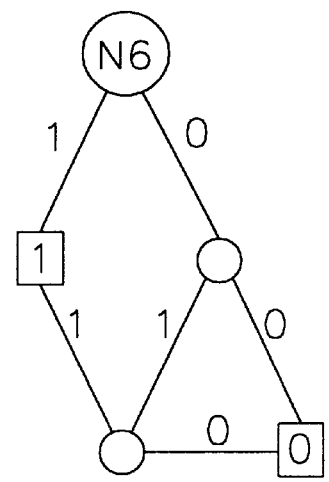
FIG. 3 is a Reduced BDD of the BDD of FIG. 2.
Figure 4:
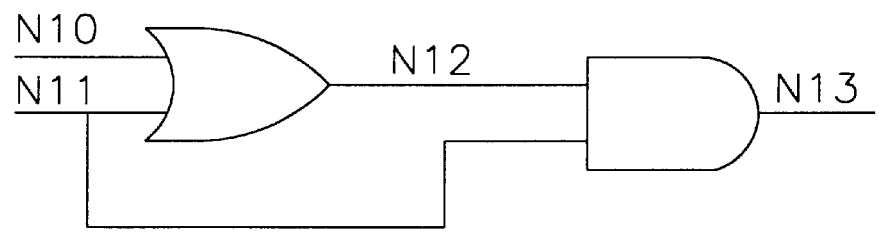
FIG. 4 is a logic design schematic illustrating the topology of a digital logic circuit.
Figure 5:
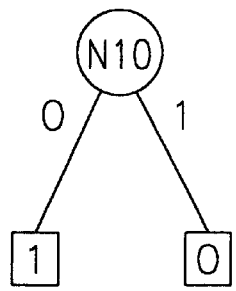
FIG. 5 is a BDD for input wire N10 of the circuit of FIG. 4.
Figure 6:
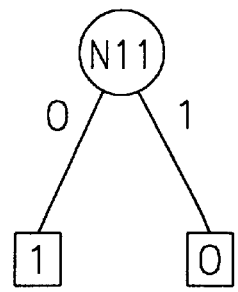
FIG. 6 is a BDD for input wire N11 of the circuit of FIG. 4.
Figure 7:
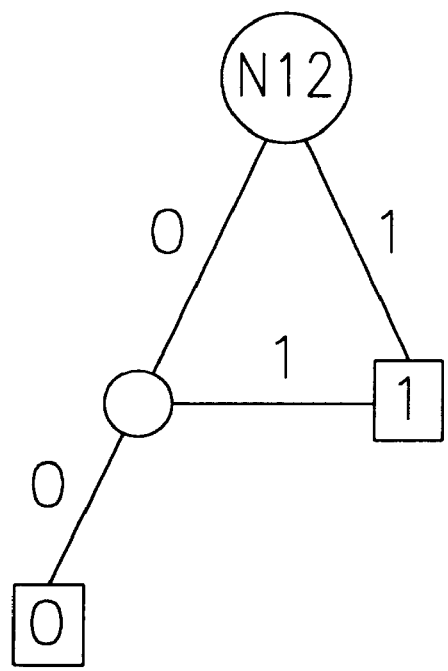
FIG. 7 is a BDD for wire N12 of the circuit of FIG. 4.
Figure 8:
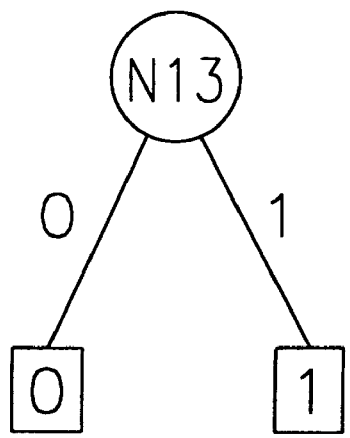
FIG. 8 is a BDD for output wire N13 of the circuit of FIG. 4.

Such a procedure provides at least two benefits. The necessity for building a BDD about the node may disappear. That is, the intermediate BDD which explodes in memory may not be necessary due to later operations. As an example, a simple circuit which has intermediate BDD's greater in size than the final BDD is shown in FIG. 4. The simple circuit comprises an OR gate 31 and an AND gate 33. The OR gate has inputs N10 and N11. The output N12 of the OR gate is fed to the AND gate, whose other input is N11. The output of the AND gate is N13. The BDD for N10 is shown in FIG. 5, and comprises a node N12 with two branches each to a terminal vertex. The BDD for N11 is similar, and is shown in FIG. 6. The BDD for N12 is shown in FIG. 7, and comprises 2 nodes. Yet the BDD for N13 has only 1 node, as shown in FIG. 8, as can be seen when it is understood that N13=(N10 or N11) AND N11, which is simply N13=N11. Thus, the final BDD for the circuit is smaller than at least one of the intermediate BDDs, and building the intermediate BDD is not necessary.

Figure 10:
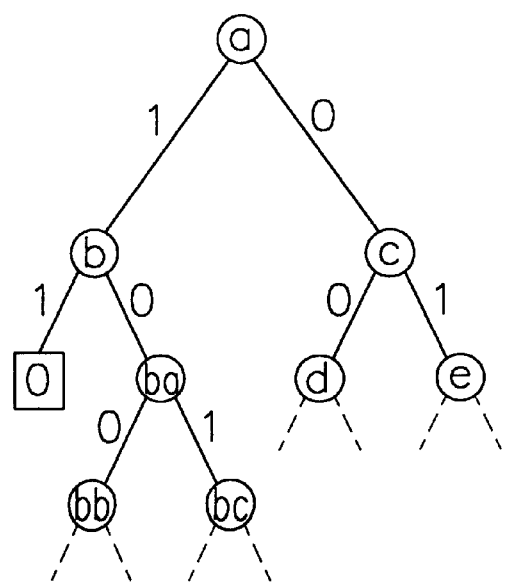
FIG. 10 is a first partitioned BDD of the BDD of FIG. 9.
Figure 11:
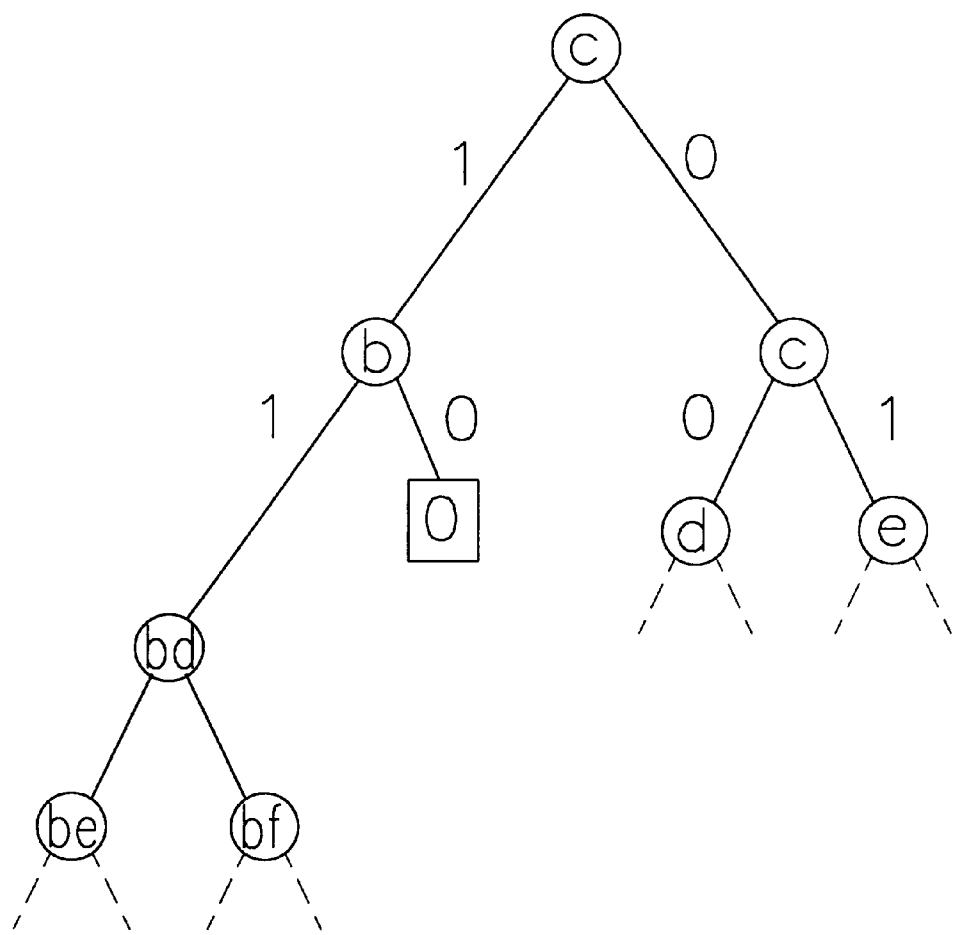
FIG. 11 is a second partitioned BDD of the BDD of FIG. 9.

Nevertheless, a canonical and easy to analyze representation for the target function (for example, the output functions) must still be built. To avoid a BDD explosion in this case, the BDD can be partitioned during composition of the decomposition points. Thus, FIGS. 10 and 11 illustrate the two partitions resulting from composing pseudo-variable b of the BDD of FIG. 9. Because such a partitioned BDD is of a smaller size than a BDD which is the sum of the partitions, a reduced amount of memory or time is required.

Figure 12:
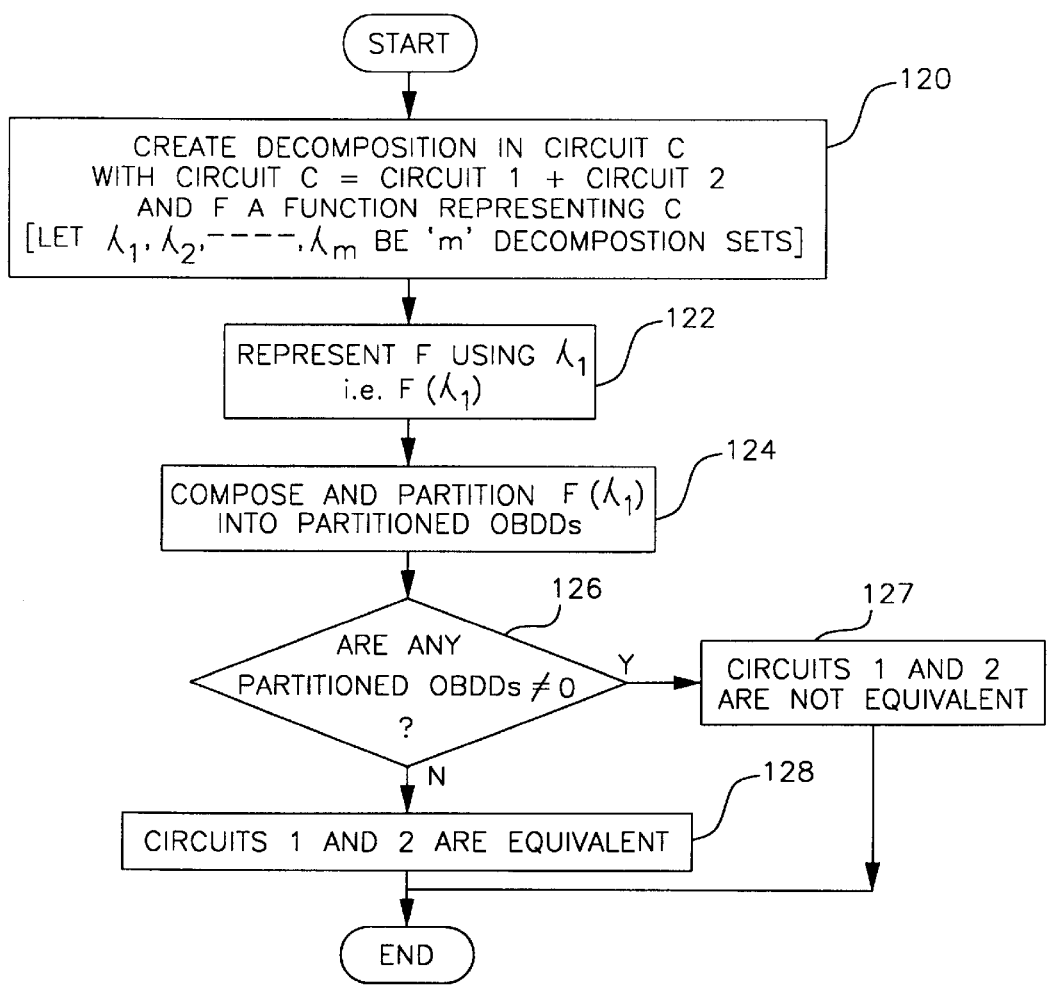
FIG. 12 is a top-level flow diagram of a partitioning verification technique of the present invention.

FIG. 12 provides an overview of a method of circuit verification for a circuit 1 and a circuit 2 using a partitioning technique. In the overview C represents a combination of circuits 1 and 2 and F is a Boolean function representing circuit C. In Step 120 a decomposition in C for decomposition sets from the primary inputs to the primary outputs is formed. In Step 122 the function F is represented by a combination of primary inputs and pseudo-variables. In Step 124 the representation of function F is composed and partitioned into Partitioned OBDDs. Step 126 determines if any of the resulting OBDDs are not equal to zero. If any of the resulting OBDDs are not equal to zero, then Step 127 declares circuit 1 and circuit 2 not equivalent. Otherwise, Step 128 declares circuit 1 and circuit 2 equivalent.

OBDDs are generated for each partition. If a partition contains another decomposition point further partitioning may need to be performed. Each partition may itself be partitioned into two disjoint Boolean spaces, and each subpartition may be further partitioned into disjoint Boolean spaces. Thus, the Boolean space may be partitioned into a large number of OBDDs, each of which are small.

Some partitions may remain too large for BDD building. The partitions, however, are formed of a decomposed partition string. The decomposed partition string is a string of components, or elements, ANDed together. If a particular partition is formed as a result of recursively partitioning a number of higher level partitions this string may include a number of components. If any of the components are ANDed together with the result being zero, then the string, and thus the partition, must also be zero.

Accordingly, the order of building a decomposed partition string is accomplished using a scheduling order. For instance, consider the problem of constructing the partitioned ROBDD of f, where f=a,b,c,d,e and a,b,c,d,e are all Boolean functions representative of some portion of a system or circuit topology. In a preferred embodiment a,b,c,d, and e are ranked both by their size (expressed in terms of number of nodes) and by the extent to which they each have a minimum of extra support with respect to each other. This ranking determines the schedule by which the components are combined, with component of minimum size and extra support combined first. The foregoing, as well as additional details, is more completely described in the following.

II. Partitioned-ROBDDs

A. Definition

Assume there is a Boolean function f: $B^n \rightarrow B$, defined over n inputs $X_n = \{x_1, \ldots, x_n\}$. The partitioned-ROBDD representation, $X_f$, of f is defined as follows:

Definition 1. Given a Boolean function $f:B^n \rightarrow B$, defined over $X_n$, a partitioned-ROBDD representation $X_f$ of f is a set of k function pairs, $X_f = \{(w_1, f_1) \ldots, (w_k, f_k)\}$ where, $w_i$:

$B^n \to B$ and $\bar{f}_i:B^n \to B$, for $1 \leq i \leq k$, are also defined over $X_n$ and satisfy the following conditions:

1. $w_i$ and $\bar{f}_i$ are represented as ROBDDs with the variable ordering $\pi_i$, for $1 \leq i \leq k$.
2. $w_1+w_2+\ldots+w_k=1$
3. $\bar{f}_i=w_i \wedge f$, for $1 \leq i \leq k$ Here, + an $\wedge$ represent Boolean OR and AND respectively. The set $\{w_1, \ldots, w_k\}$ is denoted by W. Each $w_i$ is called a window function. Intuitively, a window function $w_i$ represents a part of the Boolean space over which f is defined. Every pair $(w_i, \bar{f}_i)$ represents a partition of the function f. Here the term "partition" is not being used in the conventional sense where partitions have to be disjoint. If in addition to Conditions 1–3 in Definition 1, $w_i \wedge w_j=0$ for $i \neq j$ then the partitions are orthogonal; and each $(w_i, \bar{f}_i)$ is now a partition in the conventional sense.

Condition 1 in Definition 1 states that each partition has an associated variable ordering which may or may not be different from the variable orderings of other partitions. Condition 2 states that the $w_i$s cover the entire Boolean space. Condition 3 states that $\bar{f}_i$ is the same as f over the Boolean space covered by $w_i$. In general, each $\bar{f}_i$ can be represented as $w_i \wedge f_i$; the value of $f_i$ is a do not care for the part of the Boolean space not covered by $w_i$. The size of an ROBDD F is denoted by $|F|$. Thus the sum of the sizes of all partitions, denoted by $|X_f|$, is given by $|X_f|=(|\bar{f}_1|+\ldots|\bar{f}_k|+|w_1|+\ldots+|w_k|)$. From Conditions 2 and 3, it immediately follows that:

$$f=\bar{f}_1+\bar{f}_2+\ldots=\bar{f}_k \quad (1)$$

This type of partitioning in which f is expressed as a disjunction of $\bar{f}_i$s is called a disjunctive partition. A conjunctive partition can be defined as the dual of the above definition. That is, the $i^{th}$ partition is given by $(w_i, \bar{f}_i)$, Condition 2 in Definition 1 becomes $w_1 \wedge \ldots \wedge w_k=0$, and Condition 3 becomes $\bar{f}_i=w_i+f$. In this case $f=(\bar{f}_1 \wedge \ldots \wedge \bar{f}_k)$.

B. Canonicity of Partitioned-ROBDDs

For a given set $W=\{w_1, \ldots, w_k\}$ and a given ordering $\pi_i$ for every partition i, the partitioned-ROBDD representation is canonical. For a given function f and a given partitioned-ROBDD representation $X_f=\{(w_i, \bar{f}_i)|1 \leq i \leq k\}$ of f, $\bar{f}_i$ is unique. Since each $\bar{f}_i$ is represented as an ROBDD which is canonical (for a given ordering $\pi_i$), the partitioned-ROBDD representation is canonical.

Given a partition of the Boolean space, $W=\{w_1, \ldots, w_k\}$, the asymptotic complexity of performing basic Boolean operations (e.g. NOT, AND, OR) on the partitioned-ROBDD representations is polynomial in the sizes of the operands; the same as ROBDDs. Therefore, the compactness of representation does not cost anything in terms of the efficiency of manipulation. In fact, since partitioned-ROBDDs are in general smaller than monolithic ROBDDs and each partition can be manipulated independently, their manipulation is also more efficient.

As discussed in A. Narayan et al., Partitioned-ROBDDs—A Compact, Canonical and Efficiently Manipulable Representation of Boolean Functions, ICCAD, November 1996, incorporated herein by reference, let f and g be two Boolean functions and let $X_f=\{(w_i, \bar{f}_i)|1 \leq i \leq k\}$ and $X_g=\{(w_i, \bar{g}_i)|1 \leq i \leq k\}$ be their respective partitioned-ROBDDs satisfying Conditions 1–3 in Definition 1. Further assume that the $i^{th}$ partitions in both $X_f$ and $X_g$ have the same variable ordering $\pi_i$. Then, (a) $X_{\bar{f}}=\{(w_i, w_i \wedge \bar{f}_i)|1 \leq i \leq k\}$ is the partitioned-ROBDD representing $\bar{f}$ (i.e. NOT of f); and, (b) $X_f \odot g=\{(w_i, w_i \wedge (\bar{f}_i \odot g_i))|1 \leq i \leq k\}$ is the partitioned-ROBDD representation of $f \odot g$, where $\odot$ represents any binary operation between f and g.

C. Complexity of Operations

Given two ROBDDs F and G, the operation $F \odot G$ can be performed in $o(|F||G|)$ space and time. In partitioned-ROBDDs, different partitions are manipulated independently and the worst case time complexity of $f \odot g$ is $$\sum_{i=1}^{k}(|\bar{f}_i||\bar{g}_i|),$$

which is $O(|X_f||X_g|)$ Since only one partition needs to be in the memory at any time, the worst case space complexity is given by $\max(|\bar{f}_i||g_i|)$ which is in general $<<|X_f||X_g|$. Also similar to ROBDDs, the size of the satisfying set of a function f can be computed in $O(|X_f|)$ for orthogonally partitioned-ROBDDs.

D. Existential Quantification

Besides the basic Boolean operations, another useful operation which is extensively used in formal verification of sequential circuits is the existential quantification $(\exists_x f)$ operation. The existential quantification of variable x from the function $f(\exists_x f)$ is given by $\exists_x f=f_x+f_{\bar{x}}$ where $f_x$ and $f_{\bar{x}}$ are the positive and negative cofactors of respectively. In the partitioned-ROBDD representation, the cofactors can be obtained easily by cofactoring each $w_i$ and $\bar{f}_i$ with respect to X, i.e., $X_{f_x}=(w_{i_x}, \bar{f}_{i_x})|1 \leq i \leq k$, and $(w_i, f_i) \in X_f\}$ and $X_{f_{\bar{x}}}=(w_{i_{\bar{x}}}, \bar{f}_{i_{\bar{x}}})|1 \leq i \leq k$, and $(w_i, f_i) \in X_f\}$. But after performing the cofactoring operation, the positive and negative cofactors have different window functions (given by $w_i$ and $w_{\bar{i}}$ respectively) and the disjunction cannot be performed directly on the partitions. This problem does not arise if we choose window functions which do not depend on the variables that have to be quantified. Existential quantification can be done as follows: Let $X_f=\{(w_i,f_i)|1 \leq i \leq k\}$ be a partitioned-ROBDD representation of, f such that $\exists_x w_i=w_i$, for $1 \leq i \leq k$. Then $X \exists_x f=\{(w_i, \exists_x f_i)|1 \leq i \leq k$ is the partitioned-ROBDD representation of $\exists_x f$.

Another important operation that is frequently used is the universal quantification of X from (denoted by $\forall x f$). A sufficient condition for universal quantification is that the window functions are orthogonal in addition to being independent of the variables to be quantified. Universal quantification can be done as follows: Let $X_f=\{(w_i, f_i)|1 \leq i \leq k\}$ be a partitioned ROBDD representation of such that $\forall x w_i=w_i$ and $w_i \wedge w_j=0$ for $1 \leq i, j \leq k$ and $i \neq j$. Then $\chi \forall x f=\{(w_i, \forall x f_i)/1 \leq i \leq k\}$ is the partitioned-ROBDD representation of $\forall x f$.

III. Heuristics for Constructing Partitioned-ROBDDs

The performance of partitioned-ROBDDs depends critically on the generation of partitions of the Boolean space over which the function can be compactly represented. The issue of finding such partitions of the Boolean space is as central to the partitioned-ROBDD representation as the issue of finding good variable orderings is to monolithic ROBDDs. Some simple heuristics which are effective in generating compact orthogonally partitioned-ROBDDs are discussed below. Although a Boolean netlist model is used in the following discussion, the techniques are general and can be applied to any arbitrary sequence of Boolean operations.

A given function F is first decomposed and the window functions for creating F's partitioned-ROBDD are obtained by analyzing the decomposed BDD for F. The number of windows is decided either a priori or dynamically. After a window $w_i$ is decided, a partitioned-ROBDD corresponding to it is obtained by composing F in the Boolean space corresponding to the window $w_1$.

A. Creating a Decomposed Representation

Given a circuit representing a Boolean function $f:B^n \to B$, defined over $X_n=\{x_1 \ldots x_n\}$, the decomposition strategy consists of introducing new variables based on the increase in the ROBDD size during a sequence of ROBDD operations. A new variable is introduced whenever the total number of nodes in a ROBDD manager increases by a disproportionate measure due to some operation. For example, if R has become very large while performing the operation $R=R_1+R_2$ on ROBDDs $R_1$ and $R_2$, the operation is undone. Instead, new variables $\Psi_1$ and $\Psi_2$ are introduced and R is expressed as $\Psi_1+\Psi_2$. A separate array is maintained which contains the ROBDDs corresponding to the decomposition points. $R_1$ and $R_2$ corresponding to the $\Psi_1$ and $\psi_2$ are added to this array. In this way the instances of difficult functional manipulations are postponed to a later stage. Due to Boolean simplification many of these cases may never occur in the final result, especially if the final memory requirement is much less than the peak intermediate requirement as stated in J. Jain et al. Decomposition Techniques for Efficient ROBDD Construction, LNCS, Formal Methods in CAD 96, Springer-Verlag, November, 1996, incorporated by reference herein.

In a preferred embodiment, the check for memory explosion is done only if the manager size is larger than a predetermined threshold. Also, decomposition points are added when the ROBDD grows beyond another threshold value. This ensures that the decomposition points themselves do not have very large ROBDDs. Even a simple size-based decomposition scheme works quite effectively for demonstrating the potential of partitioned-OBDDs.

At the end of the decomposition phase a decomposed representation is obtained. The decomposed representation is $f_d(\Psi,X)$, of $f$ where $\psi=\{\psi_1, \ldots, \psi_k\}$ is called a decomposition set of the circuit and each $\psi_i \in \Psi$ is a decomposition point. Let $\Psi_{bdd}=\{\psi^{1bdd}, \ldots, \psi_{kbdd}\}$ represent the array containing the ROBDDs of the decomposition points, i.e., each $\psi_i \in \Psi$ has a corresponding ROBDD, $\psi_{1bdd} \in \psi_{bdd}$, in terms of primary input variables as well as (possibly) other $\psi_j \in \Psi$, where $\psi_j \neq \Psi_i$. Similarly, the array of $\psi_{ibddw}$ is represented by $\Psi_{bddwi}$. The composition of $\psi_i$ in $f_d(\Psi,X)$ is denoted by $f_d(\Psi,X) \cdot (\psi_i \leftarrow \psi_{ibdd})$ where, $$f_d(\Psi,X) \cdot (\psi_i \leftarrow \psi_{ibdd}) = \psi_{ibdd} \cdot f_d + \overline{\psi_{ibdd}} \cdot f_{d\psi i} \quad [4]$$

The vector composition of the $\Psi$ in $f_d(\Psi,X)$ is denoted as $f_d(\Psi;X) \cdot (\Psi \leftarrow \Psi_{bdd})$ and represents successive composition of $\psi_i$'s into $f_d$.

B. Partitioning a Decomposed Representation.

1. Creating $f$, for a given $w_i$

Given a window function $w_i$, a decomposed representation $f_d(\psi,X)$, and the ROBDD array $\psi_{bdd}$ of $f$, a $f_i$ is desired, such that the ROBDD representing $f_1=w_1 \wedge f_i$ is smaller than $f$. The following observation is pertinent:

Observation 1: Let $f_i=f_{dwi}(\psi,X)(\psi \leftarrow \Psi_{bdd})$ and $f=f_d(\psi,X)(\psi \leftarrow \Psi_{bdd})$. If $w_i$ is a cube on PIs then $|f_i| \leq |f|$ for any given variable order for f and $f$.

Proof: We are given $f_i=f_{d_{wi}}(\Psi,X)(\Psi \leftarrow \Psi_{bdd_{wi}})$. If $w_i$ depends only on PIs, then the order of cofactoring and composition can be changed. Hence, $f_i=[f_d(\Psi,X)(\Psi \leftarrow \Psi_{bdd})]_{w_i}$. This gives, $f_i=f_{w_i}$. If $w_i$ is a cube, then $|f_{w_i}| \leq |f|$ and hence $|f_i| \leq |f|$. Now, given $f_d \cdot \Psi_{bdd}$ and $w_i s_i$, the cofactors $\Psi_{w_i}$ and $f_{w_i}$. By composing $\Psi_{bdd_{wi}}$ in $f_{d_w i}$, in $f_{d_w i}$, the partition function can be created, $f_i=f_{w_i}$ is formed. So given a set of window functions $w_i$, the partitioned-ROBDD $\chi_f$ of f is given by $Xf=\{(w_i, w_i \wedge f_{w_i}) | 1 \leq i \leq k\}$. It is easy to check that the above definition satisfies all the conditions of Definition 1. If $w_i$ is a cube, $f_i$ is guaranteed to have smaller size than the ROBDD for f. Also, the ROBDD representing $w_i$ has k internal nodes where k is the number of literals in $w_i$. Since $w_i$ and $f_{w_i}$ have disjoint support, $|f_i|=|w_i \wedge f_i|=(k+|f_i|) \approx |f_i|$. Also, as each intermediate result of building $f_i$ will be smaller than that of building f, the intermediate peak memory requirement is also reduced.

Note that observation 1 does not hold in the presence of dynamic variable reordering when f and $f_i$ can have different variable orderings. However, in practice since dynamic variable reordering is working on smaller graphs in the case of partitioning it is perhaps even more effective. Even when the window function is a more complex function of PIs than a cube, $f_i=f_{w_i}$ is used. Here $f_{w_i}$ is the generalized cofactor of $f$ on $w_i$. The generalized cofactor of $f$ on $w_i$ is generally much smaller than $f$. But in this case the size of the $i^{th}$ partitioned-ROBDD $|f_i|$ can be $o(|w_i||f_i|)$ in the worst case. To avoid this, use $w_i s$ which are small while using general window functions.

2. Selection of Window Functions

Methods to obtain good window functions can be divided into two categories: a priori selection and "explosion" based selection.

a. A Priori Partitioning

A priori partitioning uses a predetermined number of PIs to partition. Thus, if partitioning is done on 'k' PIs then $2_k$ partitions are created corresponding to all the binary assignments of these variables. For example, if partitioning is done on $x_1$ and $x_2$ then four partitions $x_1 x_2$, $x_1 \overline{x_2}$, $\overline{x_1} x_2$ and $\overline{x_1} \overline{x_2}$ are created. These partitioned-ROBDDs are guaranteed to be smaller than the monolithic ROBDD. Memory requirements are always lower because only-one partition needs to be in the memory at a given time, this reduction in memory is large, and is accompanied by an overall reduction in the time taken to process all partitions as well.

In selecting variables for partitioning, it is desirable to select those variables which maximize the partitioning achieved while minimizing the redundancy that may arise in creating different partitions independently. The cost of partitioning a function $f$ on variable x is defined as $$cost_x(f) = \alpha[p_x(f)] + \beta[r_x(f)]$$

where $p_x(f)$ represents the partitioning factor and is given by, $$p_x(f) = \max\left(\frac{|f_x|}{|f|}, \frac{|f_{\bar{x}}|}{|f|}\right)$$

and $r_x(f)$ represents the redundancy factor and is given by $$r_x(f) = \frac{|f_x| + |f_{\bar{x}}|}{|f|}$$

A lower partitioning factor is good as it implies that the worst of the two partitions is small. Similarly, a lower redundancy factor is good since it implies that the total work involved in creating the two partitions is less. The variable x which has the lower overall cost is chosen for partitioning. For a given vector of functions F and a variable x, the cost of partitioning is defined as:

$$\text{cost}_x(F) = \sum_{i=1}^{k} \text{cost}_x(f_i)$$

The PIs are ordered in increasing order of their cost of partitioning $f_d$ and $\Psi$. The best 'k' PIs are selected, with 'k' a predetermined number specified by the user. A similar cost function allows selection of not only PI variables, but also pseudo-variables, such as a $\psi_{i_{bdd}}$ expressed in terms of PIs, to create partitioned-ROBDDs. In this case, the cofactor operations become generalized cofactor operations for window functions which are non-cubes. This type of selection, where all the PIs are ranked according to their cost of partitioning $f_d$ and $\Psi$, is called a static partition selection.

A dynamic partitioning strategy is one in which the best PI (say x) is selected based on $f_d$ and $\Psi$ and then the subsequent PIs are recursively selected based on $f_d$ and $\Psi$ in one partition and in $f_{d_x}$ and $\Psi_x$ in the other partition. Dynamic partitioning requires an exponential number of cofactors and can be expensive. This cost can be somewhat reduced by exploiting the fact that the only values that of interest are the sizes of the cofactors of $f_d$ and $\psi_{i_{bdd}}$S. An upper bound on the value of $|f_{d_x}|$ traversing the ROBDD of $f_d$ and taking the x=1 branch whenever the node with variable id corresponding to x is encountered. This method doesn't give the exact count as the BDD obtained by traversing the ROBDD in this manner is not reduced. The advantage is that no new nodes need to be created and the traversal is fast.

b. Explosion Based Partitioning

In this method the $\psi_{i_{bdd}}$S in $f_d$ are successively composed. If the graph size increases drastically for some composition (say $\psi_j$), a window function w is selected based on the current $f_d$ and $\psi_{j_{bdd}}$. (The window functions are either a PI and its complement or some $\psi_{k_{bdd}}$ and its complement which is expressed in terms of PIs only and has a very small size.) Once the window function w is obtained two partitions (w$\wedge f_{d_w}$, $\Psi_w$) and ($\overline{w}\wedge f_{d_w}$, $\Psi_{\overline{w}}$) are created. The explosion based partitioning routine is recursively called on each of these the partitions.

Consider two circuits A and B for which an equivalence check is desired. The circuits A and B have corresponding primary outputs $F_i$ and $F_2$. To show equivalence $F=F_1\ominus F_2=0$ must be true. To determine whether this is true a BDD is built for F using cutsets of internal equivalent points. In this process many outputs can be declared equivalent simply by building their BDDs in terms of the nearest cutset $\mu_i=\{\psi_1, \ldots, \psi_k\}$, of equivalent gates. This process can be very efficient when the output BDD for F can be easily built using $\mu_i$, and the output BDD reduces to Boolean 0. This means that $F_1$, $F_2$ are functionally equivalent. However, sometimes the BDD $F(\mu_1)$ is very large and thus cannot be constructed. $F(\mu_1)$ also may not reduce to 0, in which case the BDD must be composed in terms of another cutset $\mu_j$, where $\mu_j$ is a cutset falling between primary inputs and the previous cutset $\mu_i$. During this composition process, the BDD can again blow up before the equivalences of $F_1$, $F_2$ can be resolved. The BDD partitioning strategy essentially takes advantage of the above scenarios which are highly important ones since the normal methods fail for these cases.

The BDD partitioning strategy is, in part, to compose $F(\mu_i)$ to $F(\mu_j)$ and, if the graph size increases drastically for some composition (say of the BDD corresponding to gate $\psi_j$), to partition when the composition result exceeds some limit. To select this limit, knowledge of several size related parameters is maintained during the process of composition of BDD $F(\mu_i)$ to $F(\mu_j)$. To explain these parameters, consider that h number of BDDs have already been composed, where $1 \leq h \leq k$ from the set $\{\psi, \ldots, \psi_k\}$. As an example, assume that the order in which the BDDs are composed is according to the increasing index of the $\psi$ variables. (That is, BDDs are composed in the order $\psi_1, \psi_2, \ldots, \psi_h$.) The BDD of $\psi$ made in terms of cutset $\psi_i$ is written as $\psi_i(\mu_j)$. A routine, DYNAMIC_BDD_PARTITION, to dynamically determine when to partition a BDD makes use of the following:

Procedure: DYNAMIC_BDD_PARTITION

1. ORIG_SIZE is the original BDD size of $F(\mu_i)$ expressed in terms of cutset $\mu_j$.

2. COMPOSED_ARGUMENT_SIZE is the sum of each BDD $\psi_i(\mu_j)$, $\psi_2(\mu_j)$, $\ldots$, $\psi_h(\mu_j)$ that has been composed in the BDD $F(\mu_i)$.

3. TOTAL_INPUT_SIZE=COMPOSED_ARGUMENT_SIZE+ORIG_SIZE.

4. FINAL_SIZE is the "final" size of the BDD $F(\mu_i)$ obtained after having successively composed each of the h points $\psi_1; \psi_2, \ldots, \psi_h$. This BDD is denoted as $F_h$. Also, let the PREVIOUS_SIZE is the size of $F(\mu_i)$ after composing h−1 points.

Partitioning is invoked if (A) FINAL_SIZE>COMPOSED_ARGUMENT_SIZE*BLOW_UP_FACTOR BLOW_UP_FACTOR can be varied according to the space available on the given machine, but in a preferred embodiment is 10.

(B) FINAL_SIZE>PREVIOUS_SIZE*BLOW_UP_FACTOR/NUM In a preferred embodiment NUM is 2. Also in a preferred embodiment, this criteria is only used in determining BDD blow-ups during composition, and not while forming a decomposed representation.

(C) FINAL_SIZE>PRE_SET_MEMORY_LIMIT Additionally, partitioning is invoked if the FINAL_SIZE is greater than a preset limit on the available memory.

Figure 14:
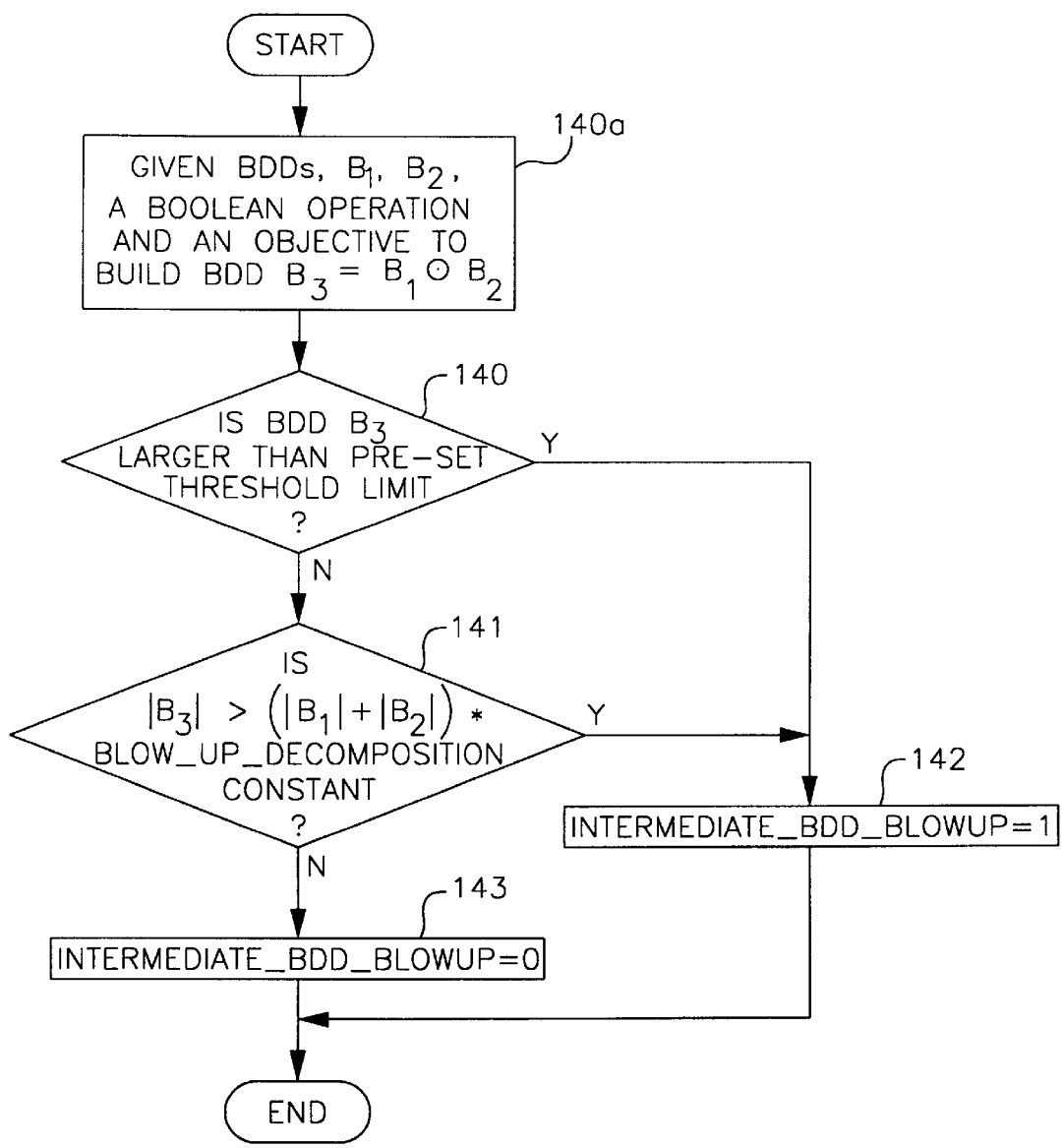
FIG. 14 is a flow diagram of a technique of determining BDD blow-ups while building a decomposed representation of the present invention.

A procedure for determining BDD blow-ups while forming a decomposed representation is illustrated in FIG. 14. In forming a decomposed representation, BDDs for an output of a Boolean operation gate are formed by performing the Boolean operation on the BDDs of the inputs to the gate. As illustrated in the procedure of FIG. 14, $B_3$ is the BDD for the output of the gate and $B_1$ and $B_2$ are the BDDs for the inputs to the gate. Step 140 determines if the size of $B_3$ is larger than a pre-set threshold limit for memory usage. Step 141 determines if the size of $B_3$ is greater than a constant times the quantity the size of $B_1$ plus the size of $B_2$. If either of the conditions of Step 140 or Step 141 are true, then an intermediate_BDD_blowup variable is set to 1 in Step 142. Otherwise, the intermediate_BDD_blowup variable is set to 0 in Step 143.

3. Equivalence Point Partitioning

The foregoing also applies to techniques based on the extraction and use of internal correspondences using a combinational of structural and functional techniques to simplify the problem of verifying the entire networks. These correspondences could be just functional equivalences, or indirect implications between their internal nodes.

The flow of these verification methods are described in U.S. patent application Ser. No. 08/857,916, incorporated by reference herein. Some of the framework of these techniques can be approximately described as the following:

1. Determining easy equivalences between internal/output gates of two given circuits. Equivalent gates are merged together. More precisely, a common pseudo-variable is introduced for both members in any equivalent (complemented) gate pairs.

2. Calculating potentially equivalent nodes in the resulting circuit using simulation.

3. Determining which potentially equivalent gates are truly equivalent. The equivalent gates between two circuits are merged.

4. Deducing equivalences of outputs using the internal equivalences determined in previous steps.

Each time two gates are merged because they are found to be equivalent (inverse), those gates are marked as equivalent (inverse) gates. At such gates a pseudo-variable is introduced during BDD construction. More specifically, cutsets of such gates are made as described in U.S. patent application Ser. No. 08/857,916 and U.S. Pat. No. 5,649,165, which is also incorporated by reference herein. If during simulation the number of potentially equivalent nodes are determined to be very few, or if during building any BDD a BDD blowup occurs, then additional decomposition points are introduced so that the BDD sizes can be kept in check. The decomposition points can be introduced using functional decomposition procedures described in J. Jain et al., Decomposition Techniques for Efficient ROBDD Construction, LNCS, Formal Methods in CAD 96, Springer-Verlag, incorporated by reference herein. Thus, the decomposition points include both functional decomposition points as well as the points which are found to be equivalent (inverse) in a given pair of circuits.

IV. Manipulating Partitions

A. Composition

Once partitioning is invoked the graphs are kept decomposed as follows. The compose in the BDD package is done using if-then-else (ITE) operations. However, the last ITE (compose) operation is undone, and the last operation decomposed as in following. Suppose on composing $\psi^h$ partitioning is invoked. For brevity of symbols in the following discussion, BDD $\psi_h(\mu_j)$ is called $B_h$. Composition can be mathematically written as follows:

$$F_h = B_h \wedge F_{h=1} \wedge \overline{B}_h \wedge F_{h=0}$$

$B_h \wedge F_{h=1}$ represents one partition ($p_1$) of the given function F and $\overline{B}_h \wedge F_{h=0}$ represents the other partition ($p_2$) of the function F. Both partitions are functionally orthogonal. Each of these partitions can be regarded as independent function, and the above process of decomposition and partitioning is once again recursively carried out, but $F(\mu_i)$ is replaced with $B_h \wedge F_{h=1}$.

If for any partition, $p_1$ for example, BDD $B_h \wedge F_{h=1}$ can be computed without any blowup, then the resulting OBDD is created. Else $p_1$ is represented with a symbolic conjunction between BDD $B_h$ and BDD $F_{h=1}$. This is a decomposed partition string and subsequent recursive calls of DYNAMIC_BDD_PARTITION() work on this decomposed partition string. So, either the remaining k–h BDDs $\psi_{h=1}, \ldots, \psi_k$ in the OBDD resulting from $p_1$ or its partition string are composed.

The next time partitioning is invoked on a decomposed partition string, due to composition of some BDD $\psi_q(\mu_j)$, a symbolic conjunction with the BDD of $\psi_q(\mu_j)$ and the decomposed partition string (conjuncted Boolean expression) in which $\psi_q(\mu_j)$ was being composed may also be required. Thus the decomposed partition string grows in length. At the end of the recursion along any branch, the resulting decomposed partition string is stored as a member of an array ($A_d$) of BDDs. Each member of this array is orthogonal to every other member in this array.

A symbolic conjunction between two BDDs B1, B2 is done by not carrying out the actual conjunction but postponing the result until some point later in the future. Thus, instead of making a new BDD B3 which is an actual conjunction between B1, B2, a symbolic_conjunction_array $A_1$ is made. $A_1$ has 3 distinct elements: BDDs B1, B2, and the conjunction operation. Symbolic_conjunction_array $A_1$ clearly represents a function this function $f(A_1)$ is equivalent to the function resulting from actually carrying out the AND between B1, B2.

Now, if we need to conjunct some BDD B4 with the function represented by $A_1$=[B1, B2, AND] we produce a result which is $A_2$ where $A_2$=[B1, B2, B4, AND]. Thus the symbolic_conjunction_array grows in length. Also, suppose if G inside symbolic_conjunction_array $A_1$ then we will compute the result as a symbolic conjunction array $A_{new}$=[B1 (G composed in B1), B2 (G composed in B2), AND] where B1 (G composed in B1) means composing BDD G inside BDD B1.

Figure 16:
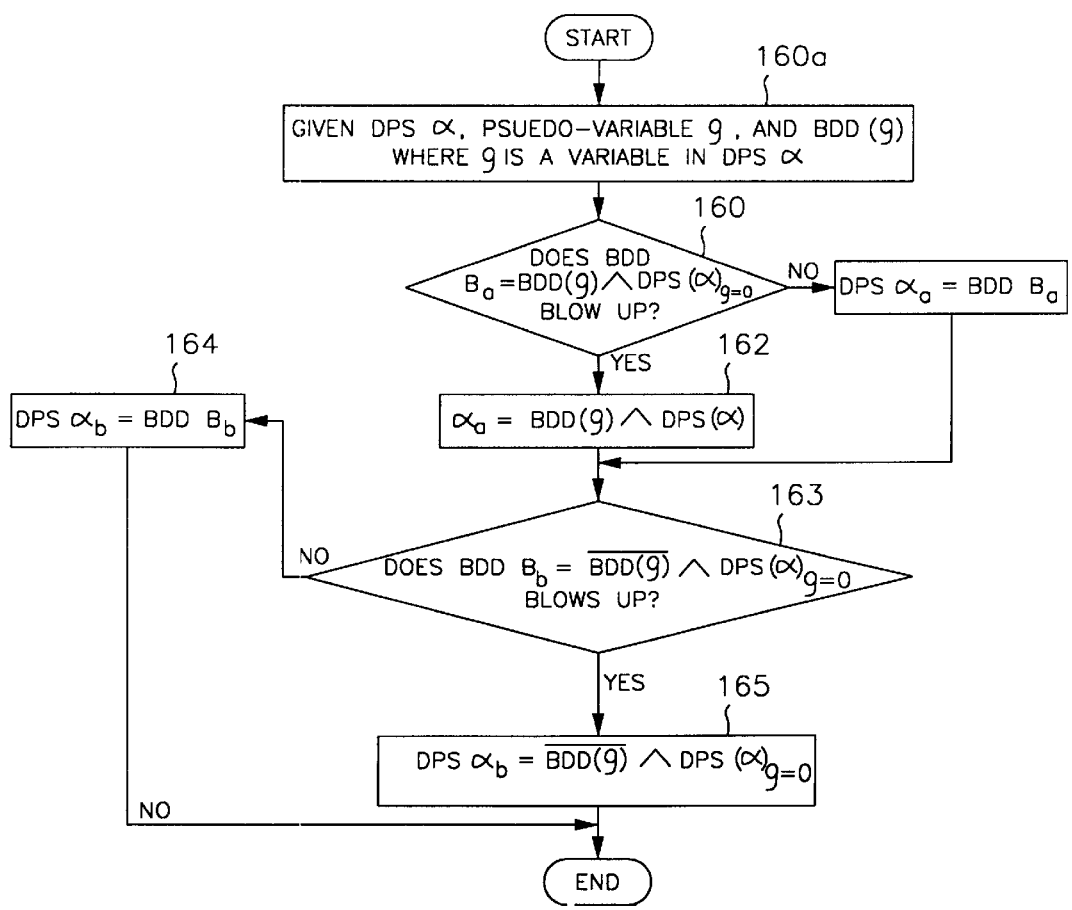
FIG. 16 is a flow diagram illustrating the decomposed partition string examination technique of the present invention.

A flow diagram for a procedure for a decomposed partition string is illustrated in FIG. 16 in which a decomposed partition string α already exists. The decomposed partition string a includes a pseudo-variable g and a BDD(g). Step 160 determines if a BDD $B_a$ blows up when $B_a$ is equal to the symbolic conjunction of BDD(g) and decomposed partition string a with g equal to one. If no blow-up occurs, decomposed partition string $\alpha_a$ is set equal to BDD $B_a$ in Step 161. Otherwise, in Step 162 decomposed partition string $\alpha_a$ is set equal to the symbolic conjunction of BDD(g) and decomposed partition string a with g equal to one. Decomposed partition string $\alpha_b$ is similarly determined using $\overline{BDD(g)}$ and decomposed partition string α with g equal to zero in place of BDD(g) and decomposed partition string α with g equal to one, respectively, in Steps 163, 164, and 165.

Note that the stored decomposed partition string is a conjunction of various $\psi_q(\mu_j)$ with a BDD that corresponds to partially composed $F(\mu_i)$. If the function F is equal to Boolean 0, then each member of this array must also be 0. Which means that if any partition is composed, then it should result in Boolean 0. Each partition is a symbolic conjunction of BDDs. Thus any partition $p_r$ is represented as conjunction of m BDDs such as $p_i = f_1 \wedge f_2 \wedge \ldots f_m \wedge F_r$. Each $f_i$ is BDD of some decomposition point whose composition was causing a blowup. $F_r$ is the BDD left after all k BDDs have been composed.

Once any member $p_i$ of the array $A_d$ is obtained, if the cutset ($\mu_i$) does not correspond to the primary inputs, and if the answer to the verification problem has not been yet obtained, then DYNAMIC-BDD-PARTITION() is used and $p_i$ is composed into another cutset ($\mu_t$). ($\mu_t$) is chosen between ($\mu_j$) and the primary inputs. This process is continued until every BDD in the decomposed-partition-string is expressed in terms of primary input variables.

Figure 15:
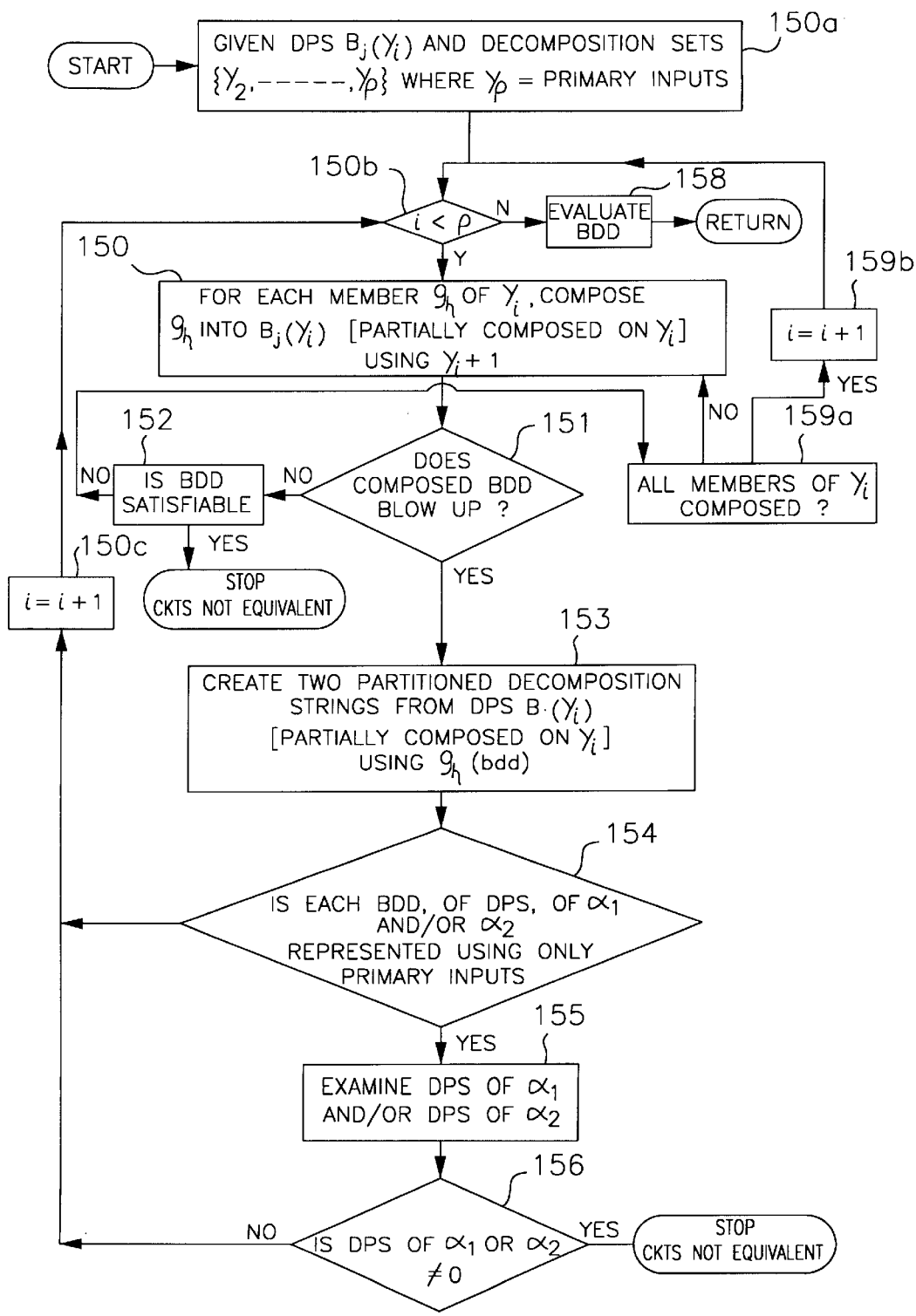
FIG. 15 is a flow diagram of the verification and decomposed partition string formation technique of the present invention.

Thus, a process for substantially the foregoing is illustrated in FIG. 15 in which a decomposed partition string (BDD) exists, but not in terms of the primary inputs. In Step 150 a composition of a decomposition point is performed. Step 151 checks to determine if the resulting composed BDD blows up. If the resulting composed BDD does not blow up and the BDD is not satisfiable, as determined in Steps 151 and 152, respectively, the process of composition is repeated for other points. If the BDD is satisfiable, the circuits under comparison are not equivalent. If, however, a BDD blow-up occurs, two decomposed partition strings are created in Step 153. Step 154 determines if these two decomposed partition strings are represented in terms of primary inputs. If so, Step 155 examines the decomposed partition strings. If the examination determines that any decomposed partition string represented in terms of primary inputs are not equal to zero, then the systems under comparison are not equivalent. Otherwise, the process is repeated until either all of the partitions have been determined to be zero and the circuits under comparison are declared equivalent.

FIG. 17 illustrates a flow diagram for a process of examining decomposed partition strings written in terms of primary inputs. In Step 170 components of such a decomposed partition string are scheduled for combination. A number of suitable scheduling techniques are discussed below, and any of these may be used for scheduling the combination order for the components. Step 171 determines if all of the components of the decomposed partition string have been examined. If not, then further components of the decomposed partition string are combined according to the schedule for combination in Step 172. The result of the combination is checked in Step 173 to determine if the result is zero. If the result is zero, the partition represented by the decomposed partition string is declared zero in Step 174. If all components of the decomposed partition string have been combined and no zero result has been obtained, then the partition represented by the decomposed partition string is declared non-zero in Step 175.

B. Equivalence Checking

The next step is to check whether the BDD $p_i = f_1 \wedge f_2 \wedge \ldots f_m \wedge F_r$ is Boolean 0. Two procedures may be used in making this determination.

1. SCHEDULING_PROCEDURE(). The Scheduling_Procedure routine arranges the BDDs in a manner which will make computing their Boolean AND easier. Methods of scheduling the components $f_1, f_2, \ldots, f_m$ for combination are detailed below.

2. LEARNING_METHOD(). The decomposed partition string may be mapped to a circuit if the sum of size of the BDDs in decomposed-partition-string is not very large. The methods such as given in R. Mukherjee et al., VERIFUL: Verification using Functional Learning, EDAC 1995 and J. Jain et al., Advanced Verification Techniques Based on Learning, DAC 1995, both of which are incorporated by reference, or the techniques disclosed in U.S. patent application Ser. No. 08/857,916 may be used to discover whether the Boolean function represented by this partition is 0.

1. Scheduling Schemes

Assume $f = g_1 \odot g_2 \odot \ldots \odot g_n$, where $\odot$=AND or OR. Let $b_i$ be the BDD corresponding to $g_i$, and $S = \{b_1, b_2, \ldots, b_n\}$. The goal is to compute ROBDD($f$) by $\odot$ing BDDs in S, two at a time.

All of the following scheduling schemes are greedy, in that at each step, they select two ROBDDs $B_i$ and $B_j$ from S such that the resulting BDD $B(i,j) = B_i \odot B_j$ is small. $B_i$ and $B_j$ are then deleted from S and $B(i,j)$ is added to S. This step is repeated until $|S|=1$.

Given a pair of BDDs $b_i$, $b_j$, and a Boolean operation $\odot$, it is well known that the worst-case size of the resulting BDD $b_i \odot b_j$ is $o(|b_i||b_j|)$. Accordingly, a size-based approach selects the two smallest BDDs $b_i$ and $b_j$, with the hope that the resulting BDD will be small as well.

Under some situations, ordering BDDs based only on sizes is not sufficient. It an happen that the two smallest BDDs $b_i$ and $b_j$ are such that $|b_i \odot b_j| = |b_i||b_j|$. However, if BDDs $b_k$ and $b_m$ that are slightly bigger but have disjoint support sets are chosen then a much smaller intermediate BDD may be obtained.

The next BDD is selected so that it introduces fewest extra variables after the operation is carried out. In other words, the first BDD ($b_i$) has minimum support and the second BDD ($b_j$) has, among all the remaining BDDs, the minimum extra support from the first BDD. Extra support is the numbers of additional variables introduced in the support of $b(i,j) = b_i \odot b_j$ as compared to ($b_i$). It is equal to $|\sup(b_j) - \sup(b_i)|$, where $\sup(b_i)$ is the support set of $b_i$.

Thus, the following scheduling orders, with the first BDD $b_i$ the minimum-sized BDD, may be used:

1. The second BDD $b_j$ is the one that shares maximum support with $b_i$
2. The second BDD $b_j$ is the one that has minimum extra support with respect to $b_i$
3. The remaining BDDs of the set S are ranked by size and extra support in $L_{size}$ and $L_{sup}$. BDDs with minimum rank (size or extra support) are earlier in the lists.

Then a very small number of BDDs (such as 3) are selected from the head of $L_{size}$ and $L_{sup}$. An explicit AND operation is performed on each of these BDDs with $b_i$. The BDD that results in the smallest size is the desired $b_j$.

2. Order of Composition

After selecting a window function and creating the decomposed representation for the $i^{th}$ partition given by $f_{dw_i}$ and $\psi_{w_i}$, the final step is to compose $\psi_{w_i}$ in $f_{dw_i}$, i.e, $f_{dw_i}(\psi, X)(\psi \leftarrow \psi_{bdd_{w_i}})$ Although the final ROBDD size is constant for a given variable ordering, the intermediate memory requirement and the time for composition is a strong function of the order in which the decomposition points are composed.

For every candidate variable that can be composed into $f_d$, cost is assigned which estimates the size of the resulting composed ROBDD. The variable with the lowest cost estimate is composed. A simple cost function based on the support set size performs well in practice. Accordingly, the decomposition variable which leads to the smallest increase in the size of the support set of the ROBDD after composition is chosen. At each step, the candidate $\psi$s for composition are restricted to those decomposition points which are not present in any of the other $\psi_{bdd}$s. This guarantees that a decomposition variable needs to be composed only once in $f_d$, as explained in A. Narayan et al., Study of Composition Schemes for Mixed Apply/Compose Based Construction of ROBDDs, Intl. Conf. on VLSI Design, January 1996, incorporated by reference herein.

V. Applications

A. Combinational ΨVerification

Partitioned ROBDDs can be directly applied to check the equivalence of two combinational circuits. The respective outputs of two circuits $f$ and $g$, are combined by an XOR gate to get a single circuit. Partitioned ROBDDs are then used to check whether the resulting circuit is satisfiable. This is simply checking whether $\bar{f}_i \oplus \bar{g}_i = 0$ for all partitions. In practice, this technique can be easily used as a back end to most implication based combinational verification methods which employ ROBDDs. Such methods are disclosed in J. Jain et al., Advanced Verification Techniques Based on Learning, DAC, p. 420–426, 1995 and S. Reddy et al., Novel Verification Framework Combining Structural and OBDD Methods in a Synthesis Environment, DAC, p. 414–419, 1995, both of which are incorporated by reference herein. Verification can be terminated even without processing all the partitions if in any window $w_i$ the function $\bar{f}_i \oplus \bar{g}_i$ is found to be satisfiable.

Another way of verifying two circuits is to probabilistically check their equivalence. Methods for doing so are disclosed in M. Blum et al., Equivalence of Free Boolean Graphs Can Be Decided Probabilistically in Polynomial Time, Information Processing Letters, 10:80–82, March 1980 and J. Jain et al., Probabilistic Verification of Boolean Functions, Formal Methods in System Design, Jul. 1, 1992, both of which are incorporated by reference herein. In probabilistic verification, every minterm of a function $f$ is converted into an integer value under some random integer assignment p to the input variables. All the integer values are then arithmetically added to get the hash code $H_p(f)$ for $f$. One can assert, with a negligible probability of error, that $f \equiv g$ iff $H_p(f)=H_p(g)$. In the case of orthogonal partitions, no two partitions share any common minterm. Hence, each partition can be hashed separately, and their hash codes added to obtain $H_p(f)$. This implies that to check if $H_p(f)=H_p(g)$, both $f$ and $g$ partitioned and has had independently. Both $\bar{f}_i$ and $\bar{g}_i$ do not need to be in the memory at the same time. Further, it is not necessary that both $f$ and g have the same window functions.

B. Sequential and FSM Verification

A key step in sequential circuit verification using ROBDDs is reachability analysis. Reachability analysis is also community called Model Checking, and Model Checking procedures are described in K. L. McMillan, Symbolic Model Checking, Klumer Academic Publishers 1993 and E. M. Clarke et al., Automatic Verification of Finite-State Concurrent Systems Using Temporal Logic Specifications, 8 TOPLAS 244–263 (1986), both of which are incorporated herein by reference. Reachability analysis consists of computing the set of states that a system can reach starting from the initial states. Given the present set of reached states, R(s), and the transition relation for the system, T(s,s'), relating present state variables, s, with the next state variables, s', the set of next states, N(s'), is evaluated using the following equation:

$$N(s')=\exists_s[T(s,s') \land R(s)] \quad (2)$$

The set of next states is added to the set of present states and the above computation is repeated until a fixed point is reached. This fixed point represents the set of all reachable states of the system.

In many cases the ROBDDs representing the transition relation T(s,s') become very large. To handle these cases, in partitioned transition relations in which the transition relations of individual latches, $T(s, s')s_2$, are represented separately (with some possible clustering of $T_i$s) is useful. The use of partitioned transition relations is described in J. R. Burch et al., Symbolic Model Checking: $10^{20}$ States and Beyond, Information and Computation, 98(2):142–170, 1992, incorporated by reference herein. Two types of partitioned transition relations were discussed: conjunctive and disjunctive. In such partitioning, the transition relation is given by $T(s,s')=T_1(s,s') \land \ldots \land T_m(s,s')$, where each $T_i$ is represented as a separate ROBDD. This type of partitioning is a special case of conjunctively partitioned-ROBDDs. The partitioning of the present invention is more general since $T_i$s need not always correspond to individual latches. The usefulness of the conjunctively partitioned transition relations is also limited because existential quantification does not distribute over conjunctions. In the worst case, if all the $T_i$'s depend on all the present state variables then conjunctive partition transitions cannot be used.

An interesting case is that of disjunctive partitions in which existential quantification distributes over the partitions. The present invention allows for disjunctively partitioning the transition relation without having to place any restrictions on the underlying model of transition for a given system. In the present invention, any set of $f_i$s such that $T(s,s')=\bar{f}_1+ \ldots +\exists_s(R(s) \land \bar{f}_k)$ can be used to represent the transition relation. The set of next states can be evaluated using the following equation:

$$N(s')=\exists_s(R(s) \land \bar{f}_1)+ \ldots +\exists_s(R(s) \land \bar{f}_k)$$

This calculation can be performed by keeping only one $\bar{f}_i$ for $1 \leq i \leq k$ in the memory. Notice that in the above calculation the window functions which correspond to $f_i$s are not needed.

Partial verification is useful for verifying sequential circuits because these circuits are often unverifiable. Using the methods and systems of the present invention provides significant information regarding such circuits.

C. Partial $\Psi$Verification Using Partitioning.

The representation of some circuits or systems cannot be compactly represented even by partitioned ROBDDs. In these cases a significant fraction of the function generally may be constructed. For example, a circuit for which 132 out of 256 partitions can be constructed before program execution aborts due to time resource constraints allows about 52% of the truth table to be analyzed. In contrast, when using monolithic ROBDDs program execution aborts without giving any meaningful partial information. A simulation technique is also inadequate in covering the given function representation of the circuit or system. When a design is erroneous, there is a high likelihood that the erroneous minterms are distributed in more than one partition and can be detected by processing only a few partitions. Thus, in many cases errors in circuits or systems can be detected by constructing only one or two partitions.

This sampling method can be applied to any design whether it is combinational, sequential, or even a mixed signal design. Generally a given design is simplified by creating partitions of its state space and analyzing only the functionality of the design within the partitions.

The circuit is partitioned by applying the partitioning vectors and the design is verified for each of the partitioning vectors. These vectors are partial assignments either on input variables or internal variables of the given circuit or system. A partial assignment is an assignment on some of the variables but not all of the variables. The partitioning vectors simplify the circuit/system so that the circuit has a smaller truth table. Thus the resulting partitioned system will be easier to verify using either model checking or combinational verification methods.

For a very complex design which cannot be verified using formal methods, the number of vectors chosen may be sufficiently small that the sampling is not very expensive in terms of computational resources. The number of variables on which partitioning is performed, however, are large enough that each partition is small enough so that formally verifying a given design is possible. As an example, for a sequential circuit with 1000 flip-flops and 100 input variables, which is very difficult to verify using traditional BDD-based methods, 100 partitions may be formed using 20 variables. The circuit may then be partially verified by examining partitions of the Boolean space of the circuit.

A fixed number of partitioning vectors may be automatically chosen using splitting variable selection approach based on the criteria of redundancy and balancedness as described in A. Narayan et al., Partitioned-ROBDDs—A Compact, Canonical and Efficiently Manipulable Representation of Boolean Functions, ICCAD, November 1996. Specifically, if we want to partition on R variables (say, 20) then a splitting variable selection approach is applied to the combinational representation of the given sequential circuits and the R number of best variables are picked automatically based upon a cost function of redundancy and balancedness. In other words, given some Z, desired number of partitions can be created by generating (say, randomly) some Z (where $Z = <2^R$) number of Boolean assignments on these R variables. These Z partial assignments are either repeated in every application of a transition relation or the Z assignments can be changed in subsequent applications of transition relation by generating different or random assignments on the given R variables. These R variables may also change in subsequent applications of transition relations.

In another embodiment, users may select input vectors from manually generated test-suites used to verify a given design. Most designs have such test-suites. Certain assignments of some subset of the input variables may be known to be critical to the design. Test-suites, however, often cannot include every possible combination of the remaining unassigned variables and therefore cannot verify the correctness of a design given assignments for some of the variables. The system and method of the present invention allow for such a verification through the use of the partitioning techniques described herein.

The specialized knowledge of engineers with knowledge of the design under test may also be utilized, either directly or indirectly. The knowledge of the engineer or designer may be directly used by selecting the test vectors under the explicit guidance as the designer. The explicit guidance may take the form of application of transition relations or the choice of vectors to use for sampling on BDD blow-ups. The designer can also supply some Q input variables, typically control variables for creating samples for verification. Given some Z, the desired number of partitions can be created by generating (say, randomly) some Z (where $Z = <2_Q$) number of Boolean assignments on the Q variables.

The knowledge of the engineer or designer may also be indirectly utilized. The manually generated test-suite for the design can be analyzed to determine partitioning vectors. Specifically all the test vectors in the test-suite can be written in an ordered fashion in a file. We can use k number of most common sequences of partial assignments in the test-suite and then use these for the sampling. So if some "sequences of partial assignments" are common between different test-vectors then such sequences are good candidates for sampling method. For purpose of clarity of description, note a string STR which is a sequence of partial assignments is derived from a sequence of input-combinations, assigned to the input variables, and can be depicted as follows:

STR=partial_1 <from-time-frame=1>; partial_2 <from-time-frame-2>; . . . ; partial_m<from-time-frame-m>, where each partial_i is a partial assignment.

Partial_1 will be used to restrict the circuit in the first application of transition relation (as explained in the next section), partial_2 in the second application of transition relation, and so on. We will collect N number of such strings STR_1, STR_2, . . . , STR_N. The choice of N can be interactive and fully depends on the complexity of the given system. For example, with many of current systems having 1000 flip-flops, we believe N can range from 5 to 100. Now, we will do formal verification by making N different runs of a formal verifier, verifying a set of simpler circuits $C_1$, $C_2$, . . . , $C_N$ where each $C_i$ is a design that has been restricted using the partial assignments in it as described above as well as in the following section.

In the scenario that the test-suite initially also contained only partial assignments on a subset of input variables then we can also see which variables occur most frequently in the given test-suite. If we want to partition on P variables (say, 20) then we look for P number of most commonly occuring variables in the test-suite. Given some Z, we can choose to create the desired number of partitions by generating (say, randomly) some Z (where $Z = <2_P$) number of Boolean assignments on these P variables. Additionally, if the user desires then he can restrict the sequence length of our chosen "sequences of partial assignments" to some first k number of time frames where k can even be 1.

Additionally, recursive testing of designs and heirarchies of designs often occurs. Thus, any vectors found to generate errors in prior testing of the design also form appropriate partitioning vectors.

Suppose the sequence of N vectors is as follows:

$[V_1=0, V_2=1]$; $[V_1, V_3=1]$; $[V_3=1; V_4=1]$; . . . , [N-such sequences]. Furthermore, a sequential circuit M can be thought of as a concatenation of several identical combinational circuits C.

The concatention is known to be done by connecting the next state variables of a circuit C to the present state variables of the circuit C coming next in the concatenation sequence. That is M can be thought of as M=$C_1$ <connected-to> $C_2$ <connected-to> $C_3$ . . . where each $C_i$ is a copy of the same combinational circuit. Thus, the circuit in time frame 3 is reffered to as circuit $C_3$.

Now, during application of, say, a state space traversal verification method, we will initially restrict the given design by setting $V_1=0$, $V_2=1$. With this restriction certain states $S_1$ are reached after application of a transition relation. $V_1=0$, $V_3=1$ are set once state $S_1$ is reached and a transition relation is applied to reach $S_2$. Once $S_2$ is reached $V_2=1$; $V_1=1$ are set and the transition relation is again applied to reach state $S_3$. This procedure continues until state $S_n$ is reached. Thus, all properties of the system for the states captured by $S_N$ can now be verified.

Also, if in some application of a transition relation the BDD representing state space $S_i$ are blowing-up then the BDD is partitioned by either manually (interactively) providing values (restrictions) on some more input variables or by throwing away a part of the reached state space. After such partitioning we again continue with our reachability analysis till we decide to terminate our computation because of a reason such as we cannot carry on a BDD based analysis any further or because we have reached the fixed-point.

In this way, though only a limited part of the functionality of the given design has been verified greater part of a very large space state has been processed. Partitioned-ROBDDs allow a remarkable control on the space/time resources and therefore functional-coverage. Thus, the success of a verification experiment can be ensured by changing the parameters of decomposition and the number of partitions that need to be created.

D. Use in a Filter Approach

The partitioning verification techniques of the present invention are also useful in the filter approach described in U.S. patent application Ser. No. 08/857,916. A filter approach utilizes a combination of communicating testing/verification techniques to verify a circuit or system. In essence, simpler and faster techniques are first used to verify or alter the circuit. If the simpler and faster techniques cannot verify the circuit, then the results of these techniques are passed to more elaborate and costly verification techniques. The most sophisticated techniques are techniques which, if given enough time and memory, can verify a circuit without the help of another verification technique. These most sophisticated techniques are referred to as core techniques. Within such a framework, the partitioned BDD techniques of the present invention are a core technique.

E. Parallel Implementation of an ROBDD Package

The present system and method invention provides a superlinear reduction (even exponential) in the resources required to build ROBDDs. Further, each partition is independent and can be scheduled on a different processor with minimal communication overhead. Each partition can also be ordered independently and can exploit full power of dynamic reordering.

Thus, the present invention provides many advantages in verification of Boolean circuits and systems. Many circuits and systems that were heretofore unverifiable can be checked for equivalence. Although the present invention has been described in certain specific embodiments, many additional modifications and variations will be apparent to those skilled in the art. It is therefore to be understood that this invention may be practiced otherwise than specifically described. Accordingly, the present embodiments of the invention should be considered in all respects illustrative and not restrictive, the scope of the invention to be indicated by the appended claims rather than the foregoing description.

What is claimed is:

1. A computer-implemented method of determining if first and second circuits, each with a set of corresponding common primary inputs and corresponding common primary outputs, are equivalent, comprising:
representing the first circuit as a first Boolean function;
representing the second circuit as a second Boolean function;
representing a Boolean space by exclusive ORinq the corresponding primary outputs of the first and second Boolean functions;
building a decomposed first Binary Decision Diagram for the Boolean space;
partitioning the Boolean space into first and second partitions during composition of a decomposition point when the Binary Decision Diagram resulting from composition exceeds a predetermined constraint on computer memory usage; and
determining if the first and second partitions are zero;
wherein determining if the first and second partitions result to zero includes:
partitioning the first partition into a plurality of first partitions;
building Binary Decision Diagrams for each of the first partitions unless a predetermined constraint on memory usage is exceeded;
building a decomposed partition string having components for at least one of the first partitions for which the predetermined constraint on memory usage was exceeded; and
combining the components in a scheduled order until a combination of components is zero.

2. The computer-implemented method of determining if first and second circuits, each with a set of corresponding common primary inputs and corresponding common primary outputs, are equivalent, of claim 1 wherein at least one of the first partitions for which Binary Decision Diagrams are built has a first ordering of primary inputs and at least one other of the first partitions for which Binary Decision Diagrams are built has a second ordering of primary inputs.

3. The computer-implemented method of determining if first and second circuits, each with a set of corresponding common primary inputs and corresponding common primary outputs, are equivalent, of claim 2 wherein the at least one of the first partitions for which Binary Decision Diagrams are built is built by a first processor and at least one other of the partitions for which Binary Decision Diagrams are built is built by a second processor.

4. The computer-implemented method of determining if first and second circuits, each with a set of corresponding common primary inputs and corresponding common primary outputs, are equivalent, of claim 2 wherein at least one of the first partitions for which Binary Decision Diagrams are built and at least one other of the partitions for which Binary Decision Diagrams are built concurrently built by the first and second processors.

5. The computer-implemented method of determining if first and second circuits, each with a set of corresponding common primary inputs and corresponding common primary outputs, are equivalent, of claim 2 wherein the predetermined constraint on memory usage is determined by dividing an amount of memory available to a computer by a constant value.

6. The computer-implemented method of determining if first and second circuits, each with a set of corresponding common primary inputs and corresponding common primary outputs, are equivalent, of claim 2 wherein the predetermined constraint on memory usage is determined by multiplying the size of a previous Binary Decision Diagram by a constant value.

7. The computer-implemented method of determining if first and second circuits, each with a set of corresponding common primary inputs and corresponding common primary outputs, are equivalent, of claim 1 wherein the scheduled order schedules smaller components for combining before larger components.

8. The computer-implemented method of determining if first and second circuits, each with a set of corresponding common primary inputs and corresponding common primary outputs, are equivalent, of claim 1 wherein the scheduled order schedules components with a maximum of common support for combining before components with a minimum of common support.

9. A method of evaluating a digital system comprising:
representing the digital system as a Boolean function, the Boolean function forming a Boolean space;
partitioning the Boolean space into first and second partitions;
forming a decomposed partition string having elements, the decomposed partition string representing the first partition; and
ordering the elements of the decomposed partition string into a scheduling order;
combining the elements according to the scheduling order.

10. The method of evaluating a digital system of claim 9 wherein the elements are ordered by size.

11. The method of evaluating a digital system of claim 9 wherein the elements are ordered by extra support.

12. The method of evaluating a digital system of claim 9 wherein the elements are ordered by size and extra support.

13. The method of evaluating a digital system of claim 12 wherein the elements are ordered by minimum size and maximum extra support.

14. The method of evaluating a digital system of claim 13 further comprising determining if the combined elements evaluate to zero after every combination.

15. A computer-implemented method of verifying a combinatorial circuit having primary inputs to which values are assignable, the primary inputs forming input vectors when the primary inputs are assigned varying values, comprising the steps of:

partitioning a Boolean space representation of the combinatorial circuit into multiple windows, no two windows sharing a common input vector;

executing an ordered BDD-based verification technique on each window to determine a verification result until a verification result is obtained or predetermined sets of constraints on computer memory usage are exceeded;

forming a decomposed partition string for each window for which the predetermined sets of constraints on computer memory usage are exceeded, the decomposed partition string being of a combination of elements;

combining the elements in a scheduled order and determining after each combination whether the decomposed partition string is zero.

16. A method of evaluating a digital system comprising:

representing the digital system as a Boolean function, the Boolean function forming a Boolean space;

recursively partitioning the Boolean space into partitions;

forming a decomposed partition string having components, the decomposed partition string representing at least one partition executing an ordered BDD-based verification technique on at least one partition not represented by a decomposed partition string; and sequentially combining the components of the decomposed partition string in a scheduled order.

17. The method of evaluating a digital system of claim 16 wherein the BDD-based verification technique is executed on a plurality of partitions not represented by a decomposed partition string.

18. The method of evaluating a digital system of claim 17 further comprising sequentially combining the components of the decomposed partition string and determining if a resulting combination is zero in a scheduled order.

19. A system for evaluating a digital circuit comprising:

means for representing the digital circuit as a Boolean function, the Boolean function forming a Boolean space;

means for partitioning the Boolean space into first and second partitions;

means for forming a decomposed partition string having elements, the decomposed partition string representing the first partition means for ordering the elements of the decomposed partition string into a scheduling order; and means for combining the elements according to the scheduling order.

20. The method of evaluating a digital system of claim 19 further comprising means for determining if any combined elements evaluate to zero.

* * * * *